(12) United States Patent
Keite-Telgenbüscher et al.

(10) Patent No.: US 10,011,742 B2
(45) Date of Patent: Jul. 3, 2018

(54) ADHESIVE TAPE FOR ENCAPSULATING AN ORGANIC ELECTRONIC ARRANGEMENT

(71) Applicant: TESA SE, Norderstedt (DE)

(72) Inventors: Klaus Keite-Telgenbüscher, Hamburg (DE); Julia Rompf, Hamburg (DE); Janika Stolze, Natendorf (DE)

(73) Assignee: TESA SE, Norderstedt (DE)

(*) Notice: Subject to any disclaimer, the term of this patent is extended or adjusted under 35 U.S.C. 154(b) by 0 days.

(21) Appl. No.: 15/128,751

(22) PCT Filed: Mar. 17, 2015

(86) PCT No.: PCT/EP2015/055480
§ 371 (c)(1),
(2) Date: Sep. 23, 2016

(87) PCT Pub. No.: WO2015/154947
PCT Pub. Date: Oct. 15, 2015

(65) Prior Publication Data
US 2017/0101556 A1    Apr. 13, 2017

(30) Foreign Application Priority Data

Apr. 11, 2014  (DE) .................. 10 2014 207 074

(51) Int. Cl.
*H01L 51/44* (2006.01)
*H01L 51/00* (2006.01)
(Continued)

(52) U.S. Cl.
CPC .......... *C09J 7/0246* (2013.01); *C09J 7/0285* (2013.01); *C09J 153/00* (2013.01); *H01L 51/004* (2013.01);
(Continued)

(58) Field of Classification Search
CPC ...... C09J 7/0246; C09J 153/00; C09J 7/0285; C09J 2467/006; C09J 2203/326;
(Continued)

(56) References Cited

U.S. PATENT DOCUMENTS

| | | |
|---|---|---|
| 4,051,195 A | 9/1977 | McWhorter |
| 4,552,604 A | 11/1985 | Green |

(Continued)

FOREIGN PATENT DOCUMENTS

| | | |
|---|---|---|
| DE | 102008047964 A1 | 3/2010 |
| DE | 102008060113 A1 | 7/2010 |

(Continued)

OTHER PUBLICATIONS

International Search report for corresponding application PCT/EP2015/055480 dated Jun. 17, 2015.
(Continued)

*Primary Examiner* — Caleen Sullivan
(74) *Attorney, Agent, or Firm* — Norris McLaughlin & Marcus PA

(57) ABSTRACT

Translucent multiphase adhesive comprising at least one continuous phase and dispersed domains, the at least one continuous phase having a refractive index of more than 1.45 and a permeation rate for water vapor of less than 100 g/m², and the disperse domains being present in a size range of 0.1 μm to 50 μm and being included in a weight fraction of not more than 10 wt % in the adhesive, characterized in that the disperse domains are polymeric in nature and have a water vapor permeation rate of less than 100 g/m²d and a refractive index of less than 1.45.

30 Claims, 2 Drawing Sheets

Figure 1:
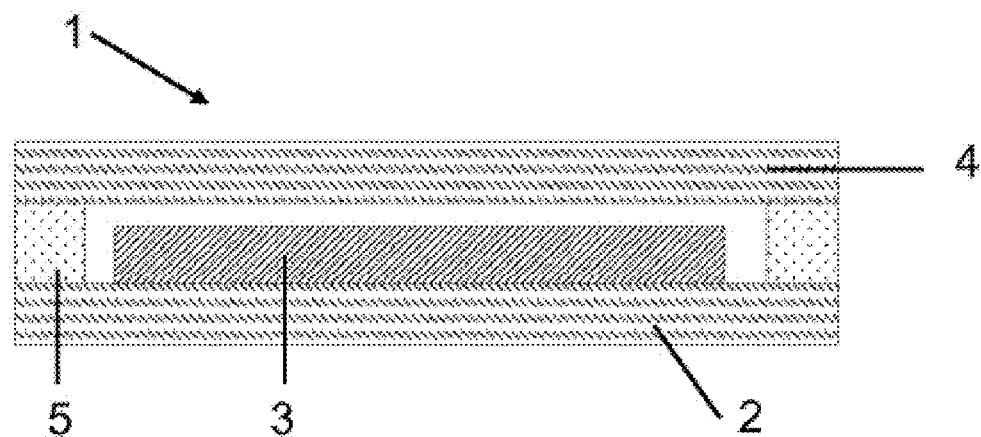

(51) Int. Cl.
*H01L 51/52* (2006.01)
*C09J 153/00* (2006.01)
*C09J 7/02* (2006.01)

(52) U.S. Cl.
CPC ........ H01L 51/0043 (2013.01); H01L 51/448 (2013.01); H01L 51/5253 (2013.01); *C09J 2201/606* (2013.01); *C09J 2203/326* (2013.01); *C09J 2205/102* (2013.01); *C09J 2453/00* (2013.01); *C09J 2467/006* (2013.01)

(58) Field of Classification Search
CPC .............. C09J 2201/606; C09J 2453/00; C09J 2205/102; H01L 51/5253; H01L 51/004; H01L 51/448; H01L 51/0043
USPC .......................................................... 438/99
See application file for complete search history.

(56) References Cited

U.S. PATENT DOCUMENTS

| | | | |
|---|---|---|---|
| 6,288,172 | B1 | 9/2001 | Goetz et al. |
| 2004/0216778 | A1 | 11/2004 | Ferri et al. |
| 2006/0087230 | A1 | 4/2006 | Ghosh et al. |
| 2006/0100299 | A1 | 5/2006 | Malik et al. |
| 2010/0068421 | A1 | 3/2010 | Tse et al. |
| 2010/0068514 | A1 | 3/2010 | Ellinger et al. |
| 2010/0137530 | A1 | 6/2010 | Arai et al. |
| 2011/0036623 | A1 | 2/2011 | Keite-Telgenbuescher et al. |
| 2011/0121356 | A1 | 5/2011 | Krawinkel |
| 2014/0315016 | A1 | 10/2014 | Dollase et al. |
| 2015/0162568 | A1* | 6/2015 | Bai ............................ C09J 7/00 438/28 |

FOREIGN PATENT DOCUMENTS

| | | |
|---|---|---|
| DE | 102009036970 A1 | 2/2011 |
| DE | 102009036986 A1 | 2/2011 |
| DE | 102012202377 A1 | 4/2013 |
| EP | 0401509 A1 | 12/1990 |
| EP | 0257545 B1 | 4/1993 |
| EP | 2078608 A1 | 7/2009 |
| EP | 2510066 A1 | 10/2012 |
| EP | 2639275 A2 | 9/2013 |
| JP | 2005263994 A | 9/2005 |
| JP | 2005298703 A | 10/2005 |
| JP | 2008310267 A | 12/2008 |
| WO | 9821287 A1 | 5/1998 |
| WO | 03002684 A1 | 1/2003 |
| WO | 03065470 A1 | 8/2003 |
| WO | 2007087281 A1 | 8/2007 |
| WO | 2008036707 A2 | 3/2008 |
| WO | 2010033558 A1 | 3/2010 |
| WO | 2010033571 A1 | 3/2010 |
| WO | 2011071689 A1 | 6/2011 |
| WO | 2014001005 A1 | 1/2014 |

OTHER PUBLICATIONS

"The Optical outcoupling of Organic Light Emitting Diodes", Fraunhofer-Institure fur Photonische Mikrosysteme, submitted by Duncan Hill, Jun. 2008, pp. 1-147, Dresden.

A.G. Erlat, et al., "Ultra-high Barrier Coatings on Polymer Substrates for Flexible Optoelectronics: Water Vapor Transport and Measurement Systems", Society of Vacuum Coaters, 2004, pp. 654-659, Dallas, Texas, USA.

M.E. Gross, et al., "Ultrabarrier Protective Coatings for Atmospherically Sensitive Thin-Film Electronic Devices", Society of Vacuum Coaters, 2003, pp. 89-92.

G. Habenicht, "Kleben", pp. 1-1123.

* cited by examiner

ADHESIVE TAPE FOR ENCAPSULATING AN ORGANIC ELECTRONIC ARRANGEMENT

This application is being filed under 35 USC 371 of PCT/EP2015/055480, filed on 17 Mar. 2015, which claims priority to DE 10 2014 207 074.0, filed 11 Apr. 2014, the full priority benefit of the above applications being claimed hereby. Additionally, the entirety of the contents of the foregoing applications are herein incorporated by reference as if set forth herein.

The present invention relates to an adhesive and an adhesive tape for encapsulating an organic electronic arrangement and to a method for its use.

PRIOR ART

Optoelectronic arrangements are being used with ever-increasing frequency in commercial products or are close to market introduction. Such arrangements comprise organic or inorganic electronic structures, examples being organic, organometallic or polymeric semiconductors or else combinations of these. Depending on the desired application, the products in question are rigid or flexible in form, there being an increasing demand for flexible arrangements. Arrangements of this kind are frequently produced by printing techniques such as relief, gravure, screen or planographic printing or else by what is known as non-impact printing such as, for instance, thermal transfer printing, inkjet printing or digital printing. In many cases, however, vacuum techniques are used as well, such as chemical vapor deposition (CVD), physical vapor deposition (PVD), plasma-enhanced chemical or physical deposition techniques (PECVD), sputtering, (plasma) etching or vapor coating. Patterning generally takes place through masks.

Examples of optoelectronic applications that are already available commercially or are of interest in terms of their market potential include electrophoretic or electrochromic constructions or displays, organic or polymeric light-emitting diodes (OLEDs or PLEDs) in readout and display devices or as illumination, and also electroluminescent lamps, light-emitting electrochemical cells (LEECs), organic solar cells such as dye or polymer solar cells, inorganic thin-film solar cells, based for example on silicon, germanium, copper, indium and selenium, perovskite solar cells or else organic laser diodes, organic or inorganic sensors.

Accordingly, in this specification, an organic optoelectronic arrangement means an electronic arrangement which comprises at least one electronically functional, at least partly organic constituent—for example, organometallic compounds—or whose electronically functional construction has a thickness of less than 20 µm.

Encompassed within this concept accordingly, for example, are inorganic thin-film solar cells and inorganic electrochromic laminates. Thicker electroluminescent constructions with inorganic particles are also encompassed, where organic—for example, polymeric—layers or matrix materials are used for the embedding of the particles, since here the organic materials take on an electronic function, as a dielectric.

Electronically functional constituents, accordingly, are to be understood to include, but not exclusively, all materials situated, within an electronic construction, between the contact electrodes (for example, anode and cathode) and any other electrically conductive layers that may be used and also the electrode layers themselves.

Not encompassed by the concept of the organic electronic arrangement, accordingly, are conventional electronic arrangements based on semiconductor wafers, since the construction in the case of such arrangements is generally thicker than 20 µm.

Used synonymously in this specification are also abbreviated terms such as "electronic arrangement" or "electronic construction", unless a different meaning is apparent from the context.

A perceived technical challenge for the realization of sufficient lifetime and function of optoelectronic arrangements in the area of organic and inorganic optoelectronics, especially of organic optoelectronics, is the protection of the components they contain against permeates. Permeates are generally considered to be gaseous or liquid substances which penetrate a solid body and may pervade it or migrate through it. Accordingly, numerous organic or inorganic compounds of low molecular mass may be permeates, with water vapor and oxygen being of particular significance in the context presently described.

A multiplicity of optoelectronic arrangements—especially where organic materials are used—are sensitive both to water vapor and to oxygen. During the lifetime of the electronic arrangements, therefore, protection is necessary through encapsulation, since otherwise there is a dropoff in performance over the application period. For example, oxidation of the constituents of light-emitting arrangements such as electroluminescent lamps (EL lamps) or organic light-emitting diodes (OLEDs) may drastically reduce the luminosity, the contrast in the case of electrophoretic displays (EP displays) or the efficiency in the case of solar cells, within a short time.

More particularly within the field of organic optoelectronics, therefore, there is a high demand for flexible adhesive bonding solutions which represent a barrier to permeates such as oxygen and/or water vapor. A number of approaches to such adhesive bonding solutions can already be found in the prior art.

By means of a liner which is impervious to permeable substances, such substances can be kept away from the electronic arrangement. This liner is customarily bonded on the electronic arrangement and/or on those regions of the substrate bearing the arrangement that are adjacent to the electronic arrangement.

Liners impervious to permeable substances may be present, for example, in the form of an impervious layer of an adhesive, which may be intended for aftertreatment, for stabilization, or for lining in turn, or else in the form of an impervious layer of a rigid or flexible material, which is bonded over the full area or at least in the edge regions and which thereby encapsulates the electronic arrangement.

For the formation of an adhesive layer and for the bonding of liner materials, with relative frequency, liquid adhesives and adhesive bonding agents based on epoxides are used as barrier adhesives, as are described in WO 98/21287 A1, U.S. Pat. No. 4,051,195 A and U.S. Pat. No. 4,552,604 A, for example. Their principal field of use is in edge bonds in rigid arrangements, but also moderately flexible arrangements. Curing takes place thermally or by means of UV radiation.

The use of these liquid adhesives is accompanied, however, by a series of unwanted effects as well. For instance, low molecular mass constituents (VOCs—volatile organic compounds) may damage the sensitive electronic structures of the arrangement and complicate production. The adhesive, furthermore, has to be applied, in a costly and inconvenient procedure, to each individual constituent of the arrangement. The acquisition of expensive dispensers and fixing devices is necessary in order to ensure precise positioning. The nature of the application has the effect, moreover, of preventing a rapid, continuous operation. In the laminating step that is subsequently necessary, the low viscosity may hinder the attainment of a defined film thickness and bond width.

An advantageous alternative is to use pressure-sensitive adhesives or hotmelt adhesives to seal optoelectronic constructions. Among the more particularly advantageous pressure-sensitive adhesives (PSAs) preference is given to using those which after bonding are crosslinkable by introduction of energy (for example, actinic radiation or heat). Adhesives of these kinds are described in US 2006/0100299 A1 and WO 2007/087281 A1 for example. Their advantage lies in particular in the fact that the barrier effect of the adhesives can be enhanced by crosslinking.

Also known in the prior art is the use of hotmelt (HM) adhesives. Used here in many cases are copolymers of ethylene, as for example ethylene-ethyl acetate (EEA), ethylene-acrylic acid copolymer (EAA), ethylene-butyl acrylate (EBA) or ethylene-methyl acrylate (EMA). Crosslinking ethylene-vinyl acetate (EVA) copolymers are in general used more particularly for solar cell modules based on silicon wafers. Crosslinking takes place during the sealing operation under pressure and at temperatures of above around 120° C. For many optoelectronic constructions based on organic semiconductors or produced in thin-film processes, this operation is deleterious, as a result of the high temperatures and the mechanical load imposed by the pressure. Synthetic rubbers such as ethylene copolymers of this kind generally also have a water vapor permeation rate of more than 100 g/m$^2$d and are therefore not suitable for the encapsulation of organic optoelectronic constructions.

For barrier adhesives, amorphous polyolefins are used preferably in hotmelt adhesives, on account of the low polarity. The advantage of the amorphous polyolefins as base materials for hotmelt adhesives is that they are saturated polymers having very good thermal stability on the part of the melt during processing, and additionally they have low melt viscosities and, in conjunction with appropriate formulation ingredients (hydrocarbon resins, waxes, plasticizers), they have favorable adhesion properties even relative to difficult-to-bond substrates. Waxes as an addition to various kinds of adhesive (for hotmelt and pressure-sensitive adhesives, for example) produce an improvement in the adhesion properties, in the tack, and in the stability, and also a reduction in the melt viscosity (see Habenicht: Kleben, 6th edition, 2009, pages 71 and 156 f.).

Important types of wax are (Habenicht, loc.cit.):
paraffin waxes having melting points in the range from 45 to 70° C. and molar weights between 225 and 500,
microcrystalline waxes having melting points in the range from 60 to 95° C.; as well as linear hydrocarbons, there are also branched and cyclic hydrocarbons present;
synthetic Fischer-Tropsch waxes having melting points in the range from 100 to 115° C.;
polyethylene waxes having melting ranges between 85 and 140° C. and molar weights in the range from 500 to 3500 g/mole.

The waxes are generally distributed molecularly in the base polymer of the hotmelt adhesive. In uncommon cases they are also present in the form of particles, as in EP 0 257 545 B1, for example. The same is also known for pressure-sensitive adhesives, as for example in EP 0 401 509 A1.

Hotmelt adhesives based on block copolymers or functionalized polymers are described in WO 2008/036707 A2, WO 2003/002684 A1, JP 2005-298703 A, and US 2004/0216778 A1, for example. An advantage of these adhesives is that the adhesives themselves do not introduce any substance—or only very little substance—into the construction to be encapsulated that itself harms the construction, whereas this problem is relevant particularly in the case of reactive liquid adhesive systems, more particularly those based on acrylate or on epoxy resin. In view of the high number of reactive groups, these systems have a relatively high polarity, and so, in particular, water is present therein. The amount is generally in the range of less than 100 ppm up to more than 1%. For this reason among others, such liquid adhesives, as already mentioned above, are used primarily as an edge sealant for the electronic arrangements, where they are not in direct contact with the active electronic materials.

Commercially customary adhesive tapes are likewise usually more or less highly permeable for permeates, meaning that the adhesive tapes must be provided with a barrier function for these same permeates. A further measure, therefore, is the equipping of the adhesive and/or of the substrate and/or of the liner of the electronic construction with binding properties for such permeates, in other words, in particular, with substances capable of sorbing the permeates and hence, denying them access to the electronic arrangement. Materials of this kind that are capable of sorbing permeable substances are referred to as getter materials or else, for short, as getters. A disadvantage of equipping the adhesive with binding properties is the adverse effect on the bonding properties as a result of the getter material. Particularly if this getter material is present in particle form in the adhesive, it occupies surface area, in the contact area with the bond substrate, that is no longer available for bonding.

In the prior art, as in WO2003/065470 A1, for instance, it is taught that the amount of getter material introduced into an adhesive should be as high as possible without unduly greatly adversely affecting the adhesive properties. Here, an amount in the 5 to 95 wt % range is considered suitable, preferably 15 to 50 wt %. Exclusively inorganic getter materials are used. The addition of such amounts of generally particulate, inorganic getter materials to the adhesive results in its becoming cloudy and also in a considerable loss of transparency.

WO 2014/001005 A1 proposes supplementarily an amount of getter material of less than 2 wt %, in order to alleviate the disadvantages stated. In one preferred embodiment, the adhesive here is transparent in the visible light of the spectrum (wavelength range from about 400 nm to 800 nm) and/or exhibits a haze of less than 5.0%, preferably less than 2.5%.

In specific optoelectronic constructions, translucency by the part of the construction through which light is beamed is desired, in order to support the in-coupling or out-coupling of light, for example. Particularly in the case of sheetlike lighting elements, the light scattering obtained as a result may contribute to a homogenization of the light pattern, thereby enabling inhomogeneities in the production of the light-emitting structure to be veiled.

In the prior art, in general, additional light out-coupling layers or light distribution layers are used in the construction of an optoelectronic arrangement. The key approaches are patterned substrates and cover layers
substrates or covers with high refractive index
out-coupling films
holographic or refractive layers or multilayer systems
additional thin layers directly adjacent to the light-emitting or light-absorbing stacks (for example, reflective layers, light-scattering layers)
optimized layers in the stack itself.

Details are set out in D. Hill: The optical outcoupling of organic light emitting diodes, Dissertation at TU Dresden, 2008, pages 30 to 36.

Figure 2:
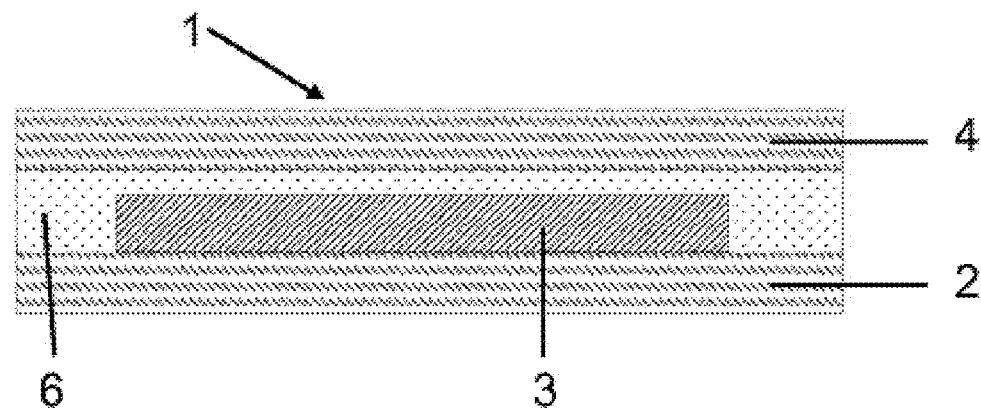
Figure 3:
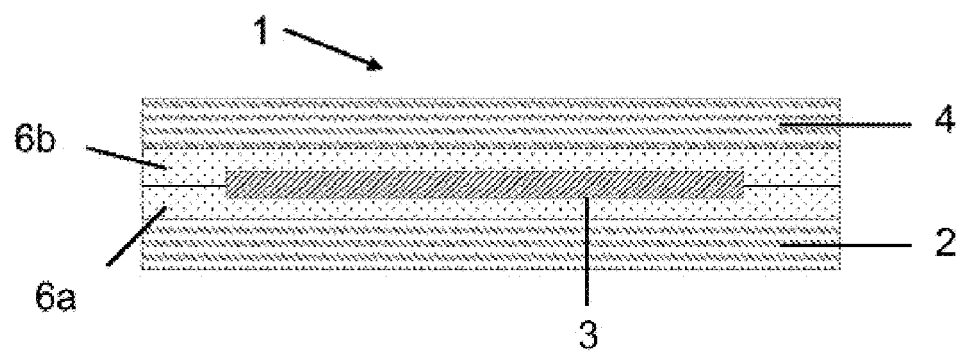

Another measure, particularly for homogenizing the incoming or outgoing light, is that of full-area encapsulation with a translucent adhesive. Full-area here means that the layer of adhesive substantially covers the light-emitting or light-absorbing layer, as shown in FIGS. 2 and 3. Translucent means that the adhesive exhibits an undirected light scattering in transmission (haze) of more than 10%.

Light scattering generally occurs at a disperse phase present in the adhesive. It will be obvious here deliberately to utilize the scattering generated by the getter material particles which are known in the prior art, which are generally inorganic. To do so, however, harbors the disadvantage that on account of their hardness and also abrasiveness of customary inorganic getter materials (for example, zeolite, silica, aluminum oxide), particles located at the interface may damage the electronic construction when the adhesive is applied, particularly in the case of lamination of an adhesive tape. Moreover, many inorganic getter materials lack transparency, thus themselves also absorbing light, thus lowering the efficiency of the optoelectronic arrangement. This is the case, for example, with zeolite, calcium oxide or aluminum oxide. Light absorption by the particles is often also wavelength-dependent, thus giving the adhesive an unwanted coloring.

Inorganic materials, moreover, are often hydrophilic, like the stated getter materials. They therefore increase the water vapor permeation rate of the adhesive, especially when they possess no water-absorbing properties or when the absorption capacity is exhausted.

Light-scattering adhesives are known in the prior art. For instance, WO 2010/033558 A1 describes a pressure-sensitive acrylate adhesive into which preferably light-scattering particles are introduced. These particles are selected from the entirety of possible light-scattering particles with a refractive index of 1.3 to 1.6, it being possible for the latter to be higher or lower than that of the adhesive. Preferred particles introduced are those of polymethyl methacrylate (PMMA, n=1.49) in a high fraction of up to 75 wt %. There is no teaching to select particles within a defined refractive index range.

EP 2 510 066 A1 likewise discloses light-scattering adhesives where preferably PMMA particles are used as scattering centers. There is also teaching to the effect that particles having a refractive index higher than that of the adhesive are advantageous.

JP 2008 310 267 A prefers silicone microparticles (n~1.403). These particles have a high water vapor permeation rate (greater than 1000 g/m² d), which is deleterious for encapsulation use.

There is therefore an ongoing need for a solution which protects an optoelectronic arrangement, especially an organic optoelectronic arrangement, reliably against the influence of permeates, and which exhibits sufficient translucency.

It is an object of the invention, therefore, to provide an adhesive which is able to contribute to reducing the disadvantages of the prior art, and which in particular provides light scattering of the adhesive with extremely little adverse effect on light transmission. As far as possible, the lifetime of an organic electronic arrangement encapsulated with the adhesive is likewise to be adversely affected as little as possible, the arrangement instead continuing to possess, in particular, a long-lasting sealing effect in the stated field of use. Advantageously the properties—especially the technical bonding properties—of the adhesive tape ought not to be substantially deleteriously altered by such modification of the adhesive.

The first object is achieved by a translucent multiphase adhesive comprising at least one continuous phase and also dispersely distributed domains, the at least one continuous phase having
a refractive index of more than 1.45 and
a water vapor permeation rate of less than 100 g/m², and
the disperse domains
are present in a size range of 0.1 µm to 50 µm and also
are present in a weight fraction of not more than 10 wt % in the adhesive,
characterized in that the disperse domains are polymeric in nature, have a refractive index of less than 1.45, and have a water vapor permeation rate of less than 100 g/m² d.

The second object is achieved by the encapsulation of the sensitive organic optoelectronic arrangement, located on a substrate, being effected by means of a cover which is fixed by means of a translucent, more particularly largely permeate-free, adhesive tape, comprising at least one layer of an adhesive of the invention.

Accordingly the invention relates to a translucent multiphase adhesive having at least one continuous phase (matrix) and also dispersely distributed polymeric domains. The continuous phase here, also referred to below as adhesive if it has self-adhesive properties, has a refractive index of more than 1.45, this applying to the majority of known adhesives. The average diameter (d50) of the polymeric disperse domains in accordance with the invention is in a size range between 0.1 µm and 50 µm. The lower limit is selected such that light is still relevantly scattered. The upper limit is selected so that layer thicknesses within the customary adhesive tape thickness range can still be easily produced, without the size of the domains causing an increase, for example, in the risk of coating defects. The weight fraction of the dispersely distributed polymeric domains in the adhesive is not more than 10 wt %, in order not substantially to impair the adhesive properties and permeation barrier. The adhesive of the invention is characterized in that the disperse polymeric domains have a refractive index of less than 1.45.

Both the continuous phase and the polymeric disperse domains have a water vapor permeation rate (WVTR) of less than 100 g/m².

Surprisingly it has emerged that with the choice of disperse polymeric domains having a refractive index of less than 1.45 and a WVTR of less than 100 g/m²d, high light scattering is achieved even with a very small weight fraction of the domains. As a result, there is little or no adverse effect on the transparency, the peel adhesion, and the barrier properties of the adhesive.

Another aspect of the invention relates to a method for protecting an organic electric arrangement disposed on a substrate, where a cover is applied to the electronic arrangement in such a way that the electronic arrangement is at least partly covered by the cover, and additionally the cover is bonded at least over part of the area to the substrate and/or to the electronic arrangement, where the bonding is effected by means of at least one layer of an adhesive. This layer of adhesive takes the form more particularly of a layer of an adhesive tape. In accordance with the invention, the method is characterized in that the adhesive is a multiphase adhesive of the invention, comprising a continuous phase and also dispersely distributed polymeric domains, the continuous phase having a refractive index of more than 1.45, and the disperse domains being present in a size range of 0.1 μm to 50 μm and also being present in a weight fraction of not more than 10 wt % in the adhesive, characterized in that the disperse polymeric domains have a refractive index of less than 1.45 and also a WVTR of less than 100 g/m²d. The adhesive employed as continuous phase is more particularly one which already inherently possesses a low permeate permeability (referred to below as adhesive with inherent barrier effect). With particular preference, at a thickness of 50 μm, the adhesive has a water vapor permeation rate of less than 50 g/(m²·d) and/or an oxygen transmission rate of less than 5000 g/(m²·d·bar).

The polymeric domains with particular preference have a water vapor permeation rate of less than 50 g/(m²·d) and/or an oxygen transmission rate of less than 5000 g/(m²·d·bar), determined on a layer of polymer with a thickness of 50 μm.

The dependent claims relate to advantageous embodiments of the adhesive and of the method.

A further subject of the invention is an adhesive tape comprising a layer of an adhesive, where the adhesive is a multiphase adhesive of the invention, comprising a continuous phase and also dispersely distributed polymeric domains, where the continuous phase has a refractive index of more than 1.45 and the disperse domains are present in a size range of 0.1 μm to 50 μm and are also present in the adhesive in a weight fraction of not more than 10 wt %, characterized in that the disperse polymeric domains have a refractive index of less than 1.45 and a WVTR of less than 100 g/m²d.

A translucent adhesive is a light-scattering adhesive having a light transmittance of more than 70% and a haze of more than 10%. The transmittance and the haze of the adhesive are determined in analogy to ASTM D1003-11 (Procedure A (Byk Haze-gard Dual haze meter), standard illuminant D65) on a layer of the adhesive 50 μm thick. There is no correction for interfacial reflection losses.

The multiphase adhesive comprises at least one continuous phase and one disperse phase. Other phases may be present—for example, a further continuous phase, thus producing a co-continuous phase structure in which one or both phases may contain the disperse phase. However, further disperse phases may also be present, provided transparency is maintained. This is often the case, for example, when the further disperse phase is nanoparticulate, thus having an average particle size of less than 100 nm.

The disperse phase is a polymer. A polymer is a chemical compound consisting of chain molecules or branched molecules (macromolecule) which consist of identical, similar or different units (referred to as the monomers). At its most simple, the macromolecule consists only of one type of monomer. Copolymers are constructed from different monomers, which within the macromolecule may be statistically distributed, regularly distributed or present in blocks. Polymers contain at least three identical monomer units. A monomer unit in the sense of this definition is the bound form of a monomer in a polymer. The disperse phase may also be present as a mixture of two or more polymers. The mixture may be a mixture of different kinds of disperse phases in the continuous phase, or else a mixture of different polymers in a single volume element of the disperse phase. The mixture within one volume element may be homogeneous or else may be present as a structure, as for example as a layer structure in a core-shell particle. It is also possible for other substances to be present which are not polymers, in which case their fraction is less than 50 wt %. The disperse phase is preferably a polymer or a mixture of two or more polymers.

The disperse phase may be present in the solid or liquid aggregate state. Hence liquid polymers as well may be dispersed in the adhesive, provided their refractive index in accordance with the invention is less than 1.45 and also their WVTR is less than 100 g/m²d. Presence in the form of solid phase is preferred, since, for example, the risk of migration of the disperse phase is smaller.

The refractive indices of the continuous phase and of the disperse domains preferably differ by more than a figure of 0.8.

The polymeric disperse domains have a refractive index of less than 1.45. The domains preferably have a refractive index of less than 1.41, more particularly preferably a refractive index of less than 1.37. The lower the refractive index, the greater the light scattering even for a small weight fraction. The amount used may therefore be reduced, which is advantageous. The refractive index is determined according to ISO 489 (method A, measuring wavelength 589 nm) at a temperature of 20° C. and a relative humidity of 50%.

The polymeric domain is preferably selected from the group of the polymers as listed in table 1:

| Abbr. | Polymer | Refractive index |
|---|---|---|
| PHFPO | Poly(hexafluoropropylene oxide) | 1.301 |
|  | Poly(tetrafluoroethylene-co-hexafluoropropylene) | 1.338 |
| FEP | Fluorinated Ethylene Propylene | 1.338 |
|  | Poly(pentadecafluorooctyl acrylate) | 1.339 |
|  | Poly(tetrafluoro-3-(heptafluoroethoxy)propyl acrylate) | 1.346 |
|  | Poly(tetrafluoro-3-(pentafluoroethoxy)propyl acrylate) | 1.348 |
| PTFE | Poly(tetrafluoroethylene) | 1.35 |
| THV | Tetrafluoroethylene hexafluoropropylene vinylidene fluoride | 1.35 |
|  | Poly(undecafluorohexyl acrylate) | 1.356 |
| PFA | Perfluoroalkoxy | 1.34 |
| ETFE | Ethylene Tetrafluoroethylene | 1.4 |
|  | Poly(nonafluoropentyl acrylate) | 1.36 |
|  | Poly(tetrafluoro-3-(trifluoromethoxy)propyl acrylate) | 1.36 |
|  | Poly(pentafluorovinyl propionate) | 1.364 |
|  | Poly(heptafluorobutyl acrylate) | 1.367 |
|  | Poly(trifluorovinyl acetate) | 1.375 |
|  | Poly(octafluoropentyl acrylate) | 1.38 |
|  | Poly(methyl 3,3,3-trifluoropropyl siloxane) | 1.383 |
|  | Poly(pentafluoropropyl acrylate) | 1.385 |
|  | Poly(2-heptafluorobutoxy)ethyl acrylate) | 1.39 |
| PCTFE | Poly(chlorotrifluoroethylene) | 1.39 |
|  | Poly(2,2,3,4,4-hexafluorobutyl acrylate) | 1.392 |
|  | Poly(trifluoroethyl acrylate) | 1.407 |
|  | Poly(2-(1,1,2,2-tetrafluoroethoxy)ethyl acrylate) | 1.412 |
|  | Poly(trifluoroisopropyl methacrylate) | 1.4177 |
|  | Poly(2,2,2-trifluoro-1-methylethyl methacrylate) | 1.4185 |
|  | Poly(2-trifluoroethoxyethyl acrylate) | 1.419 |
| PVDF | Poly(vinylidene fluoride) | 1.42 |
| ECTFE | Ethylene Chlorotrifluoroethylene | 1.447 |
|  | Poly(trifluoroethyl methacrylate) | 1.437 |
|  | Poly(isobutyl methacrylate) | 1.447 |

Source: TexLoc Refractive Index of Polymers, Parker Hannifin Corporation, Fort Worth, USA, 2007, http://www.texloc.com/closet/clrefractiveindex.html Copolymers of the stated polymers are also encompassed.

The polymer of the polymeric domains more preferably comprises fluorine. Fluoropolymers have a low water vapor permeation for a low refractive index, and therefore the adverse effect on the water vapor permeation of the adhesive is only small. In contrast, for example, pure acrylates and silicones have a water vapor permeation of higher than 100 g/m² d, thereby more greatly adversely affecting the barrier properties of the adhesive, and making them unsuitable, accordingly, for the achievement of the object.

More preferably the polymer is selected from the group of poly(hexafluoropropylene oxide) (PHFPO), fluorinated ethylene propylene polymer (FEP), poly(tetrafluoroethylene) (PTFE), poly(tetrafluoroethylene hexafluoropropylene vinylidene fluoride) (THV), perfluoroalkoxy polymer (PFA), poly(ethylene tetrafluoroethylene) (ETFE), poly(chlorotrifluoroethylene) (PCTFE), poly(vinylidene fluoride) (PVDF) and poly(ethylene chlorotrifluoroethylene) (ECTFE), and also their copolymers and terpolymers, since these polymers are readily available commercially.

The polymer of the disperse phase has a water vapor permeation rate of less than 100 g/m²d, preferably below 50 g/m²d. Particularly suitable polymers are, for example (table 2):

| Polymer | WVTR (40° C./95% rh, 50 μm) |
| --- | --- |
| PVF | 30 |
| ETFE | 12 |
| PVDC | 6 |
| PVdF | 4 |
| PFA | 4 |
| FEP | 2 |
| PCTFE | 0.2 |
| PTFE | < 10 |

In a further preferred embodiment, the polymeric domains take the form of fluorine-containing microcrystalline waxes. Such waxes are available for example under the trade name Ceridust F from Clariant, Gersthofen, or Ceraflour from Byk, Wesel.

The term "wax" according to Habenicht (loc. cit.) refers to various products which are of plant, animal or geological origin and which in relation to their chemical basis consist essentially of hydrocarbons, higher alcohols, acids, and esters. Independently of the chemical composition, the physical properties such as melting point, solubility, inertness, etc., determine the classification of a wax. The key criteria are as follows:
- a melting point of at least 40° C.,
- relatively low melt viscosity, and not stringing, in contrast to many resins,
- increasing solubility and no chemical decomposition at elevated temperature.

The light-scattering polymeric domains are present in a fraction of less than 10 wt % in the adhesive of the invention. The lower the fraction, the less the extent to which the domains impair the barrier properties of the adhesive. The fraction may be selected according to the refractive index of the domains:
if the refractive index of the domains is low, in other words below about 1.40, the preferred fraction is between 1 and 5 wt %, in order to obtain light scattering which is sufficient for numerous applications. If the refractive index of the domains is closer to 1.45, the preferred fraction is between 5 and 10 wt %.

For a high light scattering, preference is given to combining a low refractive index with a high fraction—thus, for instance, a refractive index of less than 1.40 with a fraction of 5% to 10%.

Also possible is a fraction of more than 10 wt %, in other words about up to 20 wt %, in order to achieve a particularly high scattering effect. At the same time, however, there is a more significant decrease in the transmittance.

The lower limit for technical usefulness is regarded as being in particular a fraction of the domains of 1 wt %.

The multiphase adhesive may be produced by any of the methods known to the skilled person—that is, for instance, by mixing, dispersing, emulsifying, precipitating or separating of the phases from a homogeneous phase, as known, for example, in the phase separation of block copolymers or in the impact modification of epoxy resins. The continuous phase and the disperse phase may be present alongside one another, associated with one another by no more than weak interactions, or else may be present with chemically covalent or ionic bonding to one another.

The adhesive preferably consists of a continuous phase of adhesive, and of a particulate filler distributed as dispersed phase.

"Distributed as dispersed phase" means that the filler is finely distributed within the adhesive. In principle, there are no limits on the shape and size of the particles of filler—of course, within the limitations that come about from the construction and the function of the adhesive. The feature "distributed as dispersed phase" includes a dispersion of primary filler particles, filler aggregates, and filler agglomerates, with primary particles being preferred, since there is more interface available for light scattering, and fillers of this kind are more effective.

The "distributed as dispersed phase" feature means, moreover, that the filler does not form an independent, continuous layer, but is instead present generally in the form of a plurality of distributed particles. On the other hand, it does not mean that there must be an ideal or statistical distribution of the particles of filler in the adhesive. The particles of filler may indeed, for example, be concentrated within particular regions within the adhesive, or particular regions of a layer of adhesive may also be free of filler.

In principle the size of the particles of the filler is limited by the requirements relating to the adhesive, particularly the thickness of the adhesive-comprising layer in the application or in the adhesive tape. As an upper limit on the average size of the particles, therefore, a figure of about 50 μm may be considered, but getter material is used preferably in the form of particles having an average size of not more than 20 μm, more preferably not more than 10 μm.

A lower limit is regarded as being at an average size of 0.1 μm, since below this there is substantially Rayleigh scattering, which because of its wavelength dependency may lead to a change in color of the transmitted light. The lower limit is preferably in the region of the wavelength of visible light, i.e., at 0.4 μm, since in this region the light scattering is particularly efficient.

By "average (particle) size" is meant the average maximum extent of a disperse domain. The particle size is determined preferably by means of laser diffraction according to ISO 13320 (where agglomerates, but not aggregates, are dispersed in the dispersion step), although other methods known to the skilled person are also suitable. The average size is the size at which half of the volume of the domains or particles present has a maximum extent below or equal to this size (d50).

The filler is preferably in the form of particles in a particle size distribution in which not more than 1 vol % of the filler exceeds the average layer thickness of the layer of adhesive. The advantage of this is that the particles do not protrude from the respective layer and so severely adversely affect the surface properties.

As a continuous phase it is possible in principle to use any adhesive described in the prior art (as for example in G. Habenicht: Kleben, 6th edition, Springer 2009) having a WVTR of less than 100 g/m²d. Examples of such adhesives—without wishing thereby to restrict the invention unnecessarily—are those based on vinyl acetate, polyvinyl alcohol, polyvinyl acetal, polyvinyl chloride, (meth)acrylate, polyamide and its copolymers, cellulose, urea, melamine resin, phenolic resin, epoxide, polyurethane, polyester, polyaromatic, chloroprene, nitrile rubber, styrene, butyl rubber, polysulfide or silicone. Mixtures as well are in accordance with the invention.

Very advantageously, the adhesive of the adhesive of the invention and the adhesive of the adhesive tape used in the method of the invention is a pressure-sensitive adhesive; in a further preferred version, it is an activatable adhesive. Particular preference is given to using activatable pressure-sensitive adhesives.

Pressure-sensitive adhesives (PSAs) are adhesives whose set film in the dry state at room temperature remains permanently tacky and adhesive. Even with relatively weak applied pressure, PSAs permit a durable bond to be made to the substrate, and after use can be detached again from the substrate with substantially no residue. The bondability of the adhesives is based on their adhesive properties, and their redetachability on their cohesive properties.

Activatable adhesives are seen as being adhesive systems in which the bonding is accomplished by an input of energy, by means of actinic radiation or heat, for example.

Hereinafter, the term "(pressure-sensitive) adhesive" is used in the sense of "adhesive, especially in the embodiment as pressure-sensitive adhesive". Correspondingly, the designation "(pressure-sensitive) adhesive tape" denotes "adhesive tape, especially in the embodiment as pressure-sensitive adhesive tape". The activatable versions in each case are immediately and explicitly to be included. Where the reference is only to "adhesive" or "adhesive tape", the embodiment as "pressure-sensitive adhesive tape" and "pressure-sensitive adhesive", respectively, and the embodiment as activatable adhesive, also in combination with one another (activatable pressure-sensitive adhesive), are nevertheless explicitly to be included, unless there is specifically something different indicated.

Another advantageous embodiment of the invention relates to a translucent adhesive tape comprising at least one layer of an adhesive of the invention.

In a preferred procedure an adhesive tape is used, more particularly a pressure-sensitive adhesive tape, which is employed in the form of a single layer of the (pressure-sensitive) adhesive in question. Single-layer adhesive tapes of this kind are referred to as "adhesive transfer tapes" and for greater ease of handling are frequently made available in single-sided or double-sided form with a temporary carrier, which is removed again for application. Examples of suitable temporary carriers are antiadhesive films and papers, such as siliconized films and papers.

The adhesive transfer tape may, furthermore, consist of further layers in addition to the layer of adhesive and, optionally, a layer of getter material. These further layers may be, for example, further layers of adhesive, or carrier material, or liners.

A further layer of this kind is preferably a carrier material, more particularly a polymeric carrier material, since by that means the diecuttability or applicability of the construction is enhanced.

As carrier material it is possible to use sheetlike textile structures, papers, plastic-coated papers or films/foils, with preference being given to films/foils, more particularly to dimensionally stable polymeric films or metallic foils. A carrier layer therefore consists preferably of polyesters, more particularly of polyethylene terephthalate, as for example of biaxially oriented polyethylene terephthalate, or of polyolefins, more particularly of polybutene, cycloolefin copolymer, polymethylpentene, polypropylene or polyethylene, for example of monoaxially oriented polypropylene biaxially oriented polypropylene or biaxially oriented polyethylene. Polyester films have the advantage of ensuring temperature stability and contributing enhanced mechanical stability. With very particular preference, therefore, a carrier layer in a liner of the invention consists of a polyester film, for example of biaxially oriented polyethylene terephthalate.

In one preferred embodiment the carrier material also comprises a barrier function against one or more specific permeates, more particularly against water vapor and oxygen. A barrier function of this kind may consist of organic or inorganic materials. Carrier materials with a barrier function are set out comprehensively in EP 2 078 608 A1.

With particular preference the carrier material comprises at least one inorganic barrier layer. Suitable inorganic barrier layers include metals, such as aluminum, silver, gold, nickel or, in particular, metal compounds such as metal oxides, metal nitrides or metal hydronitrides that are deposited particularly well under reduced pressure (for example by means of evaporation, CVD, PVD, PECVD) or under atmospheric pressure (for example by means of atmospheric plasma, reactive corona discharge or flame pyrolysis), examples being oxides or nitrides of silicon, of boron, of aluminum, of zirconium, of hafnium or of tellurium or indium tin oxide (ITO). Likewise suitable are layers of the aforementioned variants that are doped with further elements.

A particularly suitable method for applying an inorganic barrier layer is high-power impulse magnetron sputtering or atomic layer deposition, by means of which it is possible to realize layers which are particularly impervious to permeation, while imposing a low temperature load on the carrier layer. Preference is given to a permeation barrier, of the carrier layer with barrier function or of the assembly of carrier layer and barrier layer, against water vapor (WVTR) of <1 g/(m²*d) and/or against oxygen (OTR) of <1 cm³/(m²*d*bar), the value being based on the respective carrier layer thickness used in the sheetlike structure, in other words not standardized to a specific thickness. The WVTR is measured at 38° C. and 90% relative atmospheric humidity in accordance with ASTM F-1249, and the OTR is measured at 23° C. and 50% relative atmospheric humidity in accordance with DIN 53380-Part 3.

If the carrier material is furnished with a barrier function as described above, it may also be regarded as a liner in the method of the invention. In this case the adhesive is first applied to the liner.

Adhesive tapes which are coated on one or both of their sides with adhesives are usually wound up at the end of the production operation, to form a roll in the form of an Archimedean spiral. In the case of double-sided adhesive tapes, to prevent the adhesives contacting one another, or to prevent the adhesive sticking to the carrier in the case of single-sided adhesive tapes, the adhesive tapes are interleaved with a lining material (also referred to as release material) before being wound, and this material is wound up together with the adhesive tape. The skilled person knows of such lining materials under the name liner or release liner. Besides the lining of single-sided or double-sided adhesive tapes, liners are also employed for the backing of pure adhesives (adhesive transfer tape) and adhesive-tape sections (labels, for example).

A further main claim relates to a method for protecting an organic electrical arrangement disposed on a substrate, where a cover is applied to the electronic arrangement in such a way that the electronic arrangement is at least partly covered by the cover, where additionally the cover is bonded at least over part of the area to the substrate and/or to the electronic arrangement, where the adhesive bonding is effected by means of at least one layer of an adhesive material. The layer of adhesive here is present in particular in the form of a layer of an adhesive tape. The method is characterized in accordance with the invention in that the adhesive material is a multiphase adhesive of the invention, comprising a continuous phase and also dispersely distributed polymeric domains, the continuous phase having a refractive index of more than 1.45 and also a WVTR of less than 100 g/m$^2$d, and the disperse domains being present in a size range of 0.1 µm to 50 µm, and also being present in a weight fraction of not more than 10 wt % in the adhesive, characterized in that the disperse polymeric domains have a refractive index of less than 1.45 and also a WVTR of less than 100 g/m$^2$d.

The method of the invention can be conducted advantageously by first applying the layer of (pressure-sensitive) adhesive, optionally as part of a double-sided adhesive tape comprising further layers, and in a subsequent step applying the liner to the substrate and/or to the electronic arrangement. In a further advantageous procedure, the layer of (pressure-sensitive) adhesive, optionally as part of a double-sided adhesive tape comprising further layers, and the liner are applied jointly to the substrate and/or to the electronic arrangement.

With the method of the invention, accordingly, it is possible first to join the adhesive transfer tape to the substrate and/or electronic arrangement, or to join it first to the liner.

It is preferred, however, first to join the adhesive transfer tape to the liner, since in this way an assembly of the electronic functional unit is prefabricated, independently from the electronic arrangement, and can be laminated on as a whole.

The method of the invention may advantageously be conducted by fully covering the electronic arrangement with the liner and/or with the layer of (pressure-sensitive) adhesive, more particularly in the form of an adhesive transfer tape since then the light-scattering effect affects the entire surface of the arrangement.

Full-area lamination of the adhesive transfer tape over the electronic arrangement, moreover, rules out exposure to any harmful permeates possibly included within the gas space of a merely edge-encapsulated arrangement, since there is no gas space.

With preference in the method of the invention, a region of the substrate around the electronic arrangement is also covered wholly or partly by the liner, in which case the adhesive tape for adhesive bonding may cover the full area of the electronic arrangement and preferably likewise covers a region of the substrate around the electronic arrangement, preferably the same region as the liner—or may be applied over a partial area, in the form, for instance, of a frame around the electronic arrangement—preferably in the region which is also covered by the liner—and optionally, additionally, in an edge region on the electronic arrangement.

The adhesive of the invention, the (pressure-sensitive) adhesive tape of the invention, and the (pressure-sensitive) adhesive tape used for the method of the invention may also comprise at least one getter material capable of sorbing at least one permeable substance.

The fraction of the getter material in the (pressure-sensitive) adhesive is advantageously not more than 10 wt %, preferably not more than 5 wt %. Advantageously the fraction of the getter material in the (pressure-sensitive) adhesive is at least 0.01 wt %, preferably at least 0.05 wt %.

The size of the particles of the getter material is limited in principle by the requirements of the thickness of the layer comprising them, such as of the layer of adhesive. The getter material is used preferably in the form of particles having a grain size of not more than 50 µm, more preferably in the form of particles having a grain size of not more than 10 µm.

The getter material is preferably present in the form of particles in a particle size distribution in which not more than 1 vol % of the getter material exceeds the average layer thickness of the layer comprising getter material. This has the advantage that the getter particles do not protrude from the layer in question and hence do not greatly adversely affect the surface properties. In one particularly preferred embodiment, the entire getter material present in the adhesive transfer tape of the invention is present in a particle size distribution in which not more than 1 vol % of the getter material exceeds the average layer thickness of the layer comprising getter material.

With particular preference all of the getter materials are present in nanoscale form, meaning that the maximum extent in at least one dimension is less than 500 nm, very preferably less than 200 nm, as for example less than 100 nm. Nanoscale getter materials impair the transparency less than larger particles.

Getter materials of this kind may be, for example, dispersed pyrogenic silica such as Aerosil from Evonik, calcium oxide nanopowders from Sigma-Aldrich, calcium chloride CA-CI-02-NP from American Elements (Los Angeles), nanozeolite LTA or FAU from Nanoscape (Planegg-Martinsried) or nanoscale zeolite Lucidot NCL 40 from Clariant (Frankfurt).

"Sorbing" refers to "sorption", this being the process of selective take-up of one substance or of a plurality of substances by another substance—in accordance with the invention, by the getter material. The sorbing of the permeable substance(s) by the getter material may take place, for example, by absorption or adsorption, and adsorption may occur both in the form of chemisorption and of physisorption.

A "permeable substance" is a substance which as a gaseous or liquid substance, or possibly even as a solid substance, is able to penetrate into the adhesive to be protected, and subsequently to saturate it. Substances of this kind are referred to above and are referred to below as "permeates". The permeates may originate from the adhesive itself or from the environment, as for example from the carrier material of an adhesive tape coated with the adhesive. From the adhesive or from the adhesive tape itself come, frequently, low molecular mass organic compounds such as solvent residues, residual monomers, oils, resin components, plasticizers and water. The environment is often a source of water, volatile organic compounds (VOCs), low molecular mass hydrocarbons and oxygen. Substances considered to be "permeable substances" include more particularly water vapor and oxygen:

A "getter material" is a material which—in the sense of the process defined above as "sorption"—is able selectively or unselectively to take up at least one permeable substance. The getter material could therefore also be referred to as a "sorbent" or "sorption agent". The getter material is preferably capable at least of the sorption of water.

Examples of suitable getter materials are as follows: salts such as cobalt chloride, calcium chloride, calcium bromide, lithium chloride, lithium bromide, magnesium chloride, barium perchlorate, magnesium perchlorate, zinc chloride, zinc bromide, silicic acids (for example silica gel), aluminum sulfate, calcium sulfate, copper sulfate, barium sulfate, magnesium sulfate, lithium sulfate, sodium sulfate, cobalt sulfate, titanium sulfate, sodium dithionite, sodium carbonate, sodium sulfate, potassium disulfite, potassium carbonate, magnesium carbonate, titanium dioxide, kieselguhr, zeolites, filler silicates such as montmorillonite and bentonite, metal oxides such as barium oxide, calcium oxide, iron oxide, magnesium oxide, sodium oxide, potassium oxide, strontium oxide, aluminum oxide (activated alumina); additionally carbon nanotubes, activated carbon, phosphorus pentoxide, and silanes; readily oxidizable metals such as, for example, iron, calcium, sodium, and magnesium; metal hydrides such as, for example, calcium hydride, barium hydride, strontium hydride, sodium hydride, and lithium aluminum hydride; hydroxides such as potassium hydroxide and sodium hydroxide, metal complexes such as, for example, aluminum acetylacetonate; additionally, organic absorbers, examples being polyolefin copolymers, polyamide copolymers, PET copolyesters, anhydrides of monocarboxylic and polycarboxylic acids, such as acetic anhydride, propionic anhydride, butyric anhydride, or methyltetrahydrophthalic anhydride, isocyanates or other absorbers based on hybrid polymers, which are usually used in combination with catalysts such as cobalt, for example; further organic absorbers such as, for instance, weakly crosslinked polyacrylic acid, polyvinyl alcohol, ascorbates, glucose, gallic acid and unsaturated fats and oils. Used advantageously, particularly for the binding of oxygen, are also organometallic oxidation additives based on chelate-forming amines and transition metal complexes, particularly in conjunction with oxidizable substrate materials. In accordance with the invention, it is also possible to use mixtures of two or more getter materials.

The getter materials, in accordance with their function, are used preferably as materials substantially free from permeates, as for example water-free. This distinguishes getter materials from similar materials employed as filler. Thus, for example, silica is frequently employed as a filler, in the form of pyrogenic silica. If, however, this filler is stored as usual under ambient conditions, it already takes up water from the environment and is no longer able to function as a getter material to a technically utilizable extent. Only dried or dry-stored silica can be utilized as getter material. In accordance with the invention, however, it is also possible to use materials which are already partly complexed with permeates, examples being $CaSO_4 \cdot \frac{1}{2}H_2O$ (calcium sulfate hemihydrate), or partially hydrogenated silicas, which are present by definition as compounds of the general formula $(SiO_2)_m \cdot nH_2O$.

Silicas, as presently described, are compounds of the general formula $(SiO_2)_m \cdot nH_2O$. They comprise silicon dioxide produced by wet-chemical, thermal, or pyrogenic processes. Particularly suitable getter materials among the silicas are silica gels, examples being silica gels impregnated with cobalt compounds as a moisture indicator (blue gel), and pyrogenic (fumed) silicas. Additionally suitable among the SiO2 compounds is kieselguhr, but is not generally considered to be one of the silicas.

For the binding of oxygen, the getter material is preferably selected from the group encompassing iron, sodium dithionite, barium oxide, iron(II,III) oxide, carbohydrazide, activated aluminum oxide, zeolite, activated carbon, sulfites, ascorbates, hydrazine, morpholine, 2-butanone oxime, diethylhydroxylamine, glucose, gallic acid, unsaturated fats and oils, organometallic oxidizing additives based on chelate-forming amines and transition metal complexes, particularly in conjunction with oxidizable substrate materials.

With preference the getter material is selected from the group encompassing cobalt chloride, calcium chloride, calcium bromide, lithium chloride, lithium bromide, magnesium chloride, barium perchlorate, magnesium perchlorate, zinc chloride, zinc bromide, aluminum sulfate, calcium sulfate, copper sulfate, barium sulfate, magnesium sulfate, lithium sulfate, sodium sulfate, cobalt sulfate, titanium sulfate, sodium carbonate, sodium sulfate, potassium carbonate, zeolites, calcium, magnesium, barium oxide, calcium oxide, magnesium oxide, sodium oxide, potassium oxide, strontium oxide, activated carbon, phosphorus pentoxide, silanes, calcium hydride, barium hydride, strontium hydride, sodium hydride and lithium aluminum hydride, potassium hydroxide, sodium hydroxide, acetic anhydride, propionic anhydride, butyric anhydride, methyltetrahydrophthalic anhydride, and carbodiimides, and also mixtures of two or more of the above substances. These materials have a high sorption capacity for at least one of the abovementioned permeates, and more particularly for water as well.

"Carbodiimides" are compounds of the general formula $R^1$—N=C=N—$R^2$ in which $R^1$ and $R^2$ are organic radicals, more particularly alkyl or aryl radicals which may be identical or different.

The getter material is selected, very preferably, from calcium oxide, calcium sulfate, calcium chloride, and zeolites, and also from mixtures of two or more of the above substances. These materials have particularly high capacities for the uptake of water and other permeates, are to a very large part regenerable, can be incorporated outstandingly into the adhesive, and, in the quantity in accordance with the invention, have only a negligible effect, or none at all, on the function of this layer.

The getter material is preferably dispersed molecularly in the matrix material, since by this means both transparency and surface roughness are adversely affected to less of an extent by comparison with particles. The water-absorbing function and the light-scattering function of the adhesive are hereby functionally separated, since the molecularly dispersed getter material no longer has any light-scattering effect. Employed for this purpose in particular are isocyanates, metal complexes, silanes and organometallic compounds, preferably those organometallic Lewis acids which do not form alcohol on reaction with water. This is preferred, since the alcohol, like water, may bring about degradation of the organic electronic construction. Examples of such compounds are $Al(C_2H_5)_3$, $Al(C_4H_9)_3$, $B(C_4H_9)_3$, $Zn(C_4H_9)_2$, $Al(t\text{-butyl})_3$, $Ti(t\text{-butyl})_4$, $Mg(t\text{-butyl})_2$, $Al(C_4H_9)_2(N(C_6H_5)_2)$, $Al(C_4H_9)(N(C_6H_5)_2)_2$ and also other examples, as described in US 2006/0087230.

By "silanes" are meant compounds of the general formula $R_a$—Si—$X_{4-a}$ or their partial condensation products. In the formula, a is an integer from 0 to 3 and is preferably 0 or 1. X is a hydrolyzable group, as for example and preferably a halogen atom, more particularly chlorine, an alkoxy group such as, for example, a methoxy, ethoxy, n-propoxy, isopropoxy, n-butoxy, sec-butoxy or tert-butoxy group, or an acetoxy group. Other examples, known to the skilled person, of hydrolyzable groups may likewise be employed for the purposes of the present invention. Where two or more substituents X are present, they may be identical or different from one another. R stands for an optionally substituted hydrocarbon radical, as for example for a methyl, ethyl, n-propyl, isopropyl, n-butyl, sec-butyl, tert-butyl group, a pentyl group and also its branched isomers, a hexyl group and also the branched isomers, a heptyl group and also the branched isomers, an octyl group and also the branched isomers, a nonyl group and also the branched isomers, a decyl group and also the branched isomers, an undecyl group and also the branched isomers, a dodecyl group and also the branched isomers, a tetradecyl group and also the branched isomers, a hexadecyl group and also the branched isomers, an octadecyl group and also the branched isomers, or an eicosyl group and also the branched isomers. The hydrocarbon radicals, moreover, may include cyclic and/or aromatic components. Representative structures thereof are cyclohexyl, phenyl, and benzyl groups. The hydrocarbon radical or radicals R optionally comprises or comprise, for example, one or more heteroatom-containing substituents such as amino groups, aminoalkyl groups, glycidyloxy groups, (meth)acryloyloxy groups, and the like. Where two or more substituents R are present, they may be identical or different from one another.

A silane employable as getter material is preferably selected from the group encompassing N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, 3-aminopropyldiethoxymethylsilane, N-(2-aminoethyl)-3-aminopropyldimethoxymethylsilane, (N-butyl)-3-aminopropyltrimethoxysilane, 3-(N-ethylamino)-2-methylpropyltrimethoxysilane, 4-amino-3,3-dimethylbutyltrimethoxysilane, 4-amino-3,3-dimethylbutyldimethoxymethylsilane, (N-cyclohexyl)aminomethyldimethoxymethylsilane, (N-cyclohexyl)-aminomethyltrimethoxysilane, (N-phenyl)-3-aminopropyltrimethoxysilane, (N-phenyl)-aminomethyldimethoxymethylsilane, (N-benzyl-2-aminoethyl)-3-aminopropyltrimethoxysilane, [2-(N-benzyl-N-vinylamino)ethyl]-3-aminopropyltrimethoxysilane hydrogen chloride, [2-(N-benzyl-N-vinylamino)ethyl]-3-aminopropyltrimethoxysilane, bis(3-propyltriethoxysilyl) amine, vinyltrimethoxysilane, vinyltriethoxysilane, vinyltri(2-methoxyethoxy)silane, vinyltriisopropoxysilane, vinyldimethoxymethylsilane, vinyltriacetoxysilane, 3-triethoxysilylpropylsuccinic anhydride, 3-glycidyloxypropyltrimethoxysilane, 3-glycidyloxypropyltriethoxysilane, 2-(3,4-epoxycyclohexyl)-ethyltriethoxysilane, 3-glycidyloxypropyldiethoxymethylsilane, 3-methacryloyloxypropyltrimethoxysilane, 3-methacryloyloxypropyltriethoxysilane, 3-methacryloyloxypropyltriisopropoxysilane, 3-methacryloyloxypropyldimethoxymethylsilane, 3-methacryloyloxypropyldiethoxymethylsilane, 3-chloropropyltrimethoxysilane, 3-chloropropyltriethoxysilane, 3-isocyanatopropyltrimethoxysilane, 3-isocyanatopropyltriethoxysilane, isocyanatomethyltrimethoxysilane, isocyanatomethyldimethoxymethylsilane, tris[3-(trimethoxysilyl)propyl]isocyanurate, 3-ureidopropyltrimethoxysilane, 3-ureidopropyltriethoxysilane, 2-hydroxy-4-(3-triethoxysilylpropoxy)-benzophenone, 4-(3'-chlorodimethylsilylpropoxy)benzophenone, 3-mercaptopropyltrimethoxysilane, 3-mercaptopropyldimethoxymethylsilane, bis(3-triethoxysilylpropyl)-disulfane, bis(3-triethoxysilylpropyl)tetrasulfane, bis(triethoxysilylpropyl)polysulfane, and octadecylaminodimethyltrimethoxysilylpropylammonium chloride.

The introduction of the getter material or getter materials into the adhesive may be accomplished by all of the techniques known to the skilled person. Here, the getter material may be present in solution, dispersion, melt, or as fluid.

The adhesive is preferably a pressure-sensitive adhesive or an activatable adhesive and more particularly an activatable pressure-sensitive adhesive.

In accordance with the invention there is in principle no restriction on the chemical nature of the (pressure-sensitive) adhesives used, provided a WVTR of less than 100 g/m$^2$d is achieved. In accordance with the invention it is possible accordingly to make use, for example, of PSAs based on acrylates and/or methacrylates, polyurethanes, natural rubbers and/or silicones.

Where acrylate-based adhesives are referred to in the context of this specification, the term encompasses, without explicit reference, adhesives based on methacrylates and those based on acrylates and methacrylates, unless expressly described otherwise. Likewise suitable for use in the sense of the invention are combinations and mixtures of two or more base polymers and also adhesives additized with tackifier resins, fillers, aging inhibitors and crosslinkers, the recitation of the additives being only by way of example and being non-limiting in its interpretation.

Used very preferably are adhesives which can be kept water-free or which on account of their chemical nature contribute to an ability for the water content to be kept as low as possible. This can be achieved in particular through the use of (pressure-sensitive) adhesives having apolar properties. Used very advantageously in accordance with the invention, therefore, are (pressure-sensitive) adhesives based on synthetic rubbers; styrene block copolymer adhesives with an elastomer block composed of unsaturated or hydrogenated polydiene blocks, such as polybutadiene, polyisoprene, copolymers of both, for example, and also further elastomer blocks familiar to the skilled person; and PSAs based on polyolefins.

Great preference is given to (pressure-sensitive) adhesives based on styrene block copolymers, polybutylenes and polyolefins, since they are notable for a high permeation barrier against water vapor and also for a low water content.

Heat-activatedly bonding adhesives can be classed in principle in two categories: thermoplastic heat-activatedly bonding adhesives (hotmelt adhesives) and reactive heat-activatedly bonding adhesives (reactive adhesives). Likewise encompassed are those adhesives which can be assigned to both categories, namely reactive thermoplastic heat-activatedly bonding adhesives (reactive hotmelt adhesives).

Thermoplastic adhesives are based on polymers which on heating undergo reversible softening and solidify again during cooling. Thermoplastic adhesives which have emerged as being advantageous are especially those based on purely alkenic polyolefins. Copolymers of polyolefins with non-alkenes, such as ethylene-vinyl acetate (EVA), for example, and acid-based derivatives of alkenic polyolefins often already have a WVTR of greater than 100 g/m$^2$.

Here as well, with particular preference in accordance with the invention, the activatable adhesives are selected that possess apolar properties, since in this way the water content can be kept low and the barrier effect with respect to water vapor is good. Particularly preferred in particular, therefore, are the adhesives based on polyolefins.

In contrast, reactive heat-activatedly bonding adhesives comprise reactive components. The latter constituents are also identified as "reactive resins", in which heating initiates a crosslinking process which after the end of the crosslinking reaction ensures a durable, stable bond. Such adhesives also comprise elastic components, for example synthetic nitrile rubbers or styrene block copolymers. Such elastic components give the heat-activatedly bonding adhesive particularly high dimensional stability even under pressure, on account of their high flow viscosity.

Particularly preferred as reactive heat-activatedly bonding adhesives are those based on styrene block copolymers, on account of their apolar character and of the resultant WVTR, existing generally after activation, of less than 100 g/m²d.

Radiation-activated adhesives are likewise based on reactive components. The latter constituents may comprise, for example, polymers or reactive resins in which the irradiation initiates a crosslinking process which after the end of the crosslinking reaction ensures a durable, stable bond. Such adhesives preferably also comprise elastic components, such as those recited above.

In general activatable adhesives based on (meth)acrylates cannot be used due to the excessively high WVTR; preferred is the use of activatable adhesives based on epoxides, oxetanes, or modified styrene block copolymers.

The adhesive of the invention itself preferably has a permeate content of less than 1000 ppm, more preferably of less than 500 ppm. The ppm figure here refers to the relation between the total weight of permeates present and the analyzed weight of adhesive. The permeate content may be determined by means of gas chromatography in accordance with VDA 277 or, in the case of water, in accordance with DIN EN ISO 62 (gravimetric method, method 4) or DIN 53715 (Karl-Fischer titration) after storage of the test specimen for 24 hours at 23° C. and 50% relative atmospheric humidity. In the case of low permeate contents of the adhesive, less permeate is introduced by the adhesive itself into the electronic construction, and, where appropriate, the capacity of the getter materials is not so greatly taxed by permeates present in the adhesive, but the adhesive is able better to fulfill its function as a liner which protects against permeates from the environment or indeed binds permeates from the electronic arrangement itself.

The adhesive has a permeation rate for water vapor of less than 100 g/(m²d). The water vapor permeation rate (WVTR) is preferably less than 50 g/(m²d), more preferably less than 20 g/(m²d), based on an adhesive thickness of 50 μm. The WVTR here is measured at 38° C. and 90% relative atmospheric humidity in accordance with ASTM F-1249.

Preferably, the adhesive also has an oxygen permeation rate (OTR) of less than 5000 cm³/m²d bar, more particularly less than 2000 cm³/m²d bar, measured at 23° C. and 50% relative atmospheric humidity in accordance with DIN 53380-Part 3.

As a result of the low permeation rate on the part of the adhesive, less permeate diffuses from the environment through the adhesive and into the electronic arrangement, thereby increasing the life thereof.

As (pressure-sensitive) adhesives with inherent barrier effect, more particularly as those (pressure-sensitive) adhesives which at a thickness of 50 μm have a water vapor permeation rate of less than 50 g/(m²·d) and/or an oxygen transmission rate of less than 5000 cm³/(m²·d·bar), it is possible for example—without any intention of confining them to the example given—to use the following:

Adhesives based on vinylaromatic block copolymers, more particularly as set out in, for example, DE 10 2008 047 964 A. These are, in particular, PSAs. In one advantageous embodiment, such PSAs contain polymer blocks formed of vinylaromatics, more particularly of styrene; furthermore, they advantageously include polymer blocks formed by polymerization of 1,3-dienes, especially butadiene and/or isoprene, and/or contain specifically or completely hydrogenated polymer blocks. The polyvinylaromatic fraction of the block copolymers is advantageously 10 wt % to 35 wt %. With preference the PSA has a vinylaromatic block copolymer fraction of at least 20 wt %, preferably of at least 30 wt %, more preferably of at least 35 wt %; and/or it has a vinylaromatic block copolymer fraction of not more than 80 wt %, preferably of not more than 65 wt %, more preferably of not more than 60 wt %. The PSA may comprise one or more resins or one or more resin mixtures, preferably hydrogenated resins having a degree of hydrogenation of at least 90%, more preferably at least 95%. In one preferred variant it comprises at least one resin having a DACP of more than 30° C. and an MMAP of more than 50° C., preferably a DACP of more than 37° C. and an MMAP or more than 60° C., and/or the PSA comprises at least one resin which has a softening temperature of more than 95° C., more particularly of more than 100° C. There may be one or more additives included, preferably selected from the group consisting of the following: plasticizing agents, primary antioxidants, secondary antioxidants, process stabilizers, light stabilizers, processing aids, endblock reinforcer resins, polymers, especially those elastomeric in nature. It is advantageous for the PSA, especially after crosslinking, to have an elongation at break of at least 20%, more particularly as described in, for example, DE 10 2009 036 970 A. Mention may be made in particular of partly crosslinked PSAs based on acid-modified or acid anhydride-modified vinylaromatic block copolymers. Very advantageously the PSA comprises polymer blocks formed from vinylaromatics, especially styrene. Further advantageous are those PSAs based on acid-modified or acid anhydride-modified vinylaromatic block copolymers, containing polymer blocks formed by polymerization of 1,3-dienes, especially butadiene and/or isoprene, and/or specifically or completely hydrogenated polymer blocks.

These PSAs may advantageously be crosslinked with amines and/or epoxy resins and/or metal chelates. As metal chelates it is possible with preference to use those which may be represented with the formula $(R_1O)_nM(XR_2Y)_m$, where M is a metal from main group 2, 3, 4 or 5 or a transition metal; $R_1$ is an alkyl or aryl group such as methyl, ethyl, butyl, isopropyl or benzyl; n is zero or a larger integer, X and Y are nitrogen or oxygen, and may in each case also be bonded through a double bond to $R_2$; $R_2$ is an alkylene group which connects X and Y and may be branched, or else may contain oxygen or other heteroatoms in the chain; m is an integer, but is at least 1. The chelate may advantageously be an acetylacetonate, more particularly aluminum acetylacetonate.

In one advantageous version, the block copolymers have a polyvinylaromatic fraction of 10 wt % to 35 wt %. The fraction of the vinylaromatic block copolymers in the PSA is preferably at least 30 wt %, more preferably at least 40 wt %, very preferably at least 45 wt %. Advantageously the fraction of the vinylaromatic block copolymers in the PSAs ought not to exceed 80 wt %, preferably 70 wt %.

The PSA may comprise a resin or a resin mixture, preferably hydrogenated resins having a degree of hydrogenation of at least 90%, more preferably at least 95%. The PSA may comprise one or more additives, preferably selected from the group encompassing plasticizing agents, primary antioxidants, secondary antioxidants, process stabilizers, light stabilizers, processing aids, endblock reinforcer resins, polymers, especially those of elastomeric nature. The PSA may comprise one or more fillers, such as nanoscale fillers, transparent fillers. Advantageously the fillers are nanoscale in at least one dimension.

Polyolefin-based adhesives, particularly as described in, for example, DE 10 2008 062 130 A. PSAs based on a semicrystalline polyolefin are particularly preferred, with the polyolefin having a density of between 0.86 and 0.89 g/cm$^3$, preferably between 0.86 and 0.88 g/cm$^3$, very preferably between 0.86 and 0.87 g/cm$^3$, and a crystallite melting point of at least 90° C., preferably of at least 115° C., very preferably of at least 135° C. Advantageously the polyolefin is combined with at least one tackifying resin, in which case the amount of tackifying resin is preferably 130 to 350 phr, more preferably 200 to 240 phr. With further advantage the PSA comprises a hydrogenated resin, preferably having a degree of hydrogenation of at least 90%, more preferably of at least 95%. There may be one or more additives included, preferably selected from the group consisting of the following: plasticizers, primary antioxidants, secondary antioxidants, process stabilizers, light stabilizers, processing aids, UV blockers.

Adhesives based on isobutylene and/or based on butylene block copolymer, especially those according to DE 10 2008 060 113 A, for example. Particularly preferred are PSAs based on isobutylene block copolymers. The PSA preferably comprises polymer blocks formed from vinylaromatics, more particularly styrene, and polymer blocks formed by polymerization of isobutylene or of isobutylene in combination with n-butene and/or 1,3-dienes, especially butadiene and/or isoprene. The block copolymers preferably have a polyvinylaromatic fraction of 10 wt % to 35 wt %. The fraction of the block copolymers in the PSA is preferably at least 20 wt %, more preferably at least 30 wt %, very preferably at least 35 wt %, and/or not more than 90 wt %, preferably not more than 75 wt %, more preferably not more than 70 wt %. It is advantageous if the fraction of the isobutylene block copolymers in the total fraction of the block copolymers is at least 40 wt %, preferably at least 55 wt %. The PSA may comprise a resin or a resin mixture; it preferably comprises hydrogenated resins having a degree of hydrogenation of at least 90%, more preferably of at least 95%. The resin present in the PSA preferably has a DACP of more than 30° C. and an MMAP of more than 50° C., preferably a DACP of more than 37° C. and an MMAP of more than 60° C., and/or a softening temperature of more than 95° C., more particularly of more than 100° C. There may be one or more additives included, preferably selected from the group consisting of the following: plasticizing agents, primary antioxidants, secondary antioxidants, process stabilizers, light stabilizers, processing aids, endblock reinforcer resins, and polymers, especially those elastomeric in nature.

Activatable adhesives, more particularly as set out in DE 10 2009 036 986 A. Preferably these are thermally activatable pressure-sensitive or hotmelt adhesives, which can be activated advantageously by means of heat generated by ultrasound or magnetic induction; in particular, the heat is generated inside the adhesive by means of suitable activatable additions. For this purpose it is possible for iron oxide particles enveloped with silicon dioxide to be provided within the adhesive, for example.

Adhesives based on epoxides, such as epoxy resins, for example, especially as described in, for example, US 2010/0137530 A. This specification shows, in particular, photocurable compositions comprising (A) an epoxy resin having at least two glycidyl groups in each molecule and having a number-average molecular weight Mn of 200 to 7000, (B) an epoxy resin having at least one glycidyl group in each molecule and having a number-average molecular weight of 20 000 to 100 000, (C) a latent acidic photocatalyst, which is amenable to activation of the acid functionality by irradiation, and also (D) a silane adhesion promoter having at least one glycidyl group in each molecule, wherein the amount of component (B) is 30 to 150 parts by weight, based on 100 parts by weight of component (A), and wherein the amounts of components (C) and (D) are in each case 0.1 to 10 parts by weight, based on 100 parts by weight of the components (A) and (B) together, and where the composition is not fluid at 25° C. but is fluid in a range from 50° C. to 100° C. The photocurable composition preferably has a moisture content of less than 1500 ppm.

Adhesives, as are described for example in DE 10 2012 202 377 A1, preferably comprising (a) at least one copolymer containing at least isobutylene or butylene as comonomer kind and at least one comonomer kind which—viewed as a hypothetical homopolymer—has a softening temperature of greater than 40° C., (b) at least one kind of an at least partly hydrogenated tackifier resin, (c) at least one kind of a reactive resin based on cyclic ethers with a softening temperature of less than 40° C., preferably less than 20° C., (d) at least one kind of a photoinitiator for the initiation of cationic curing; and less preferably adhesives comprising (a) at least one copolymer containing at least isobutylene or butylene as comonomer kind and at least one comonomer kind which—viewed as a hypothetical homopolymer—has a softening temperature of greater than 40° C., (b) at least one kind of an at least partly hydrogenated tackifier resin, (e) at least one kind of a reactive resin based on acrylates or methacrylates with a softening temperature of less than 40° C., preferably less than 20° C., (d) at least one kind of a photoinitiator for initiating cationic curing. The copolymer or copolymers may for example be random, alternating, block, star and/or graft copolymers having a molar mass $M_w$ of 300 000 g/mol or less, preferably 200 000 g/mol or less. The copolymer or copolymers as block, star and/or graft copolymers have in one preferred embodiment at least one kind of a first polymer block ("soft block") with a softening temperature of less than −20° C. and at least one kind of a second polymer block ("hard block") with a softening temperature of greater than +40° C. In this case the soft block may be of apolar construction and may comprise butylene or isobutylene as homopolymer block or copolymer block, the latter preferably copolymerized with itself or with one another or with other comonomers which with particular preference are apolar. It is advantageous if the hard block is composed of styrene, styrene derivatives and/or other aromatic or (cyclo)aliphatic hydrocarbon monomers. It is further advantageous if the at least one block copolymer is a triblock copolymer constructed from two hard end blocks and one soft middle block. The tackifier resin or resins preferably have a degree of hydrogenation of at least 70%, more preferably of at least 95%. The adhesive may advantageously comprise one or more additives, selected independently of one another from the following group:

resins which have a DACP of more than 30° C. and an MMAP of more than 50° C., preferably a DACP of more than 37° C. and an MMAP of more than 60° C.;
reactive resins which carry at least one epoxide group or at least one oxetane group;
reactive resins of aliphatic or cycloaliphatic nature,
photoinitiators which absorb UV light below 350 nm and which permit cationic curing, especially sulfonium-, iodonium-, and metallocene-based systems;
photoinitiators which absorb UV light above 250 nm and below 350 nm;
plasticizing agents,
primary antioxidants,
secondary antioxidants,
process stabilizers,
light stabilizers,
processing aids,
endblock reinforcer resins,
polymers, especially those elastomeric in nature;
fillers, preferably nanoscale fillers, transparent fillers, and/or getter fillers and/or scavenger fillers.

The substantive matter disclosed in each of the cited specifications is explicitly referenced. The naming of the aforementioned examples is not intended to impose any unnecessary restriction on the choice of adhesive suitable in accordance with the invention.

The invention further provides an optoelectronic arrangement, more particularly an organic optoelectronic arrangement comprising at least one optoelectronic structure and a layer of an adhesive of the invention, the layer of adhesive covering the optoelectronic structure over the full area.

Further details, features and advantages of the present invention are elucidated in more detail below with reference to preferred exemplary embodiments. In the drawing FIG. 1 shows an (opto)electronic arrangement according to the prior art, in a diagrammatic representation, FIG. 2 shows a first (opto)electronic arrangement of the invention, in diagrammatic representation, and FIG. 3 shows a second (opto)electronic arrangement of the invention, in diagrammatic representation.

Figure 4:
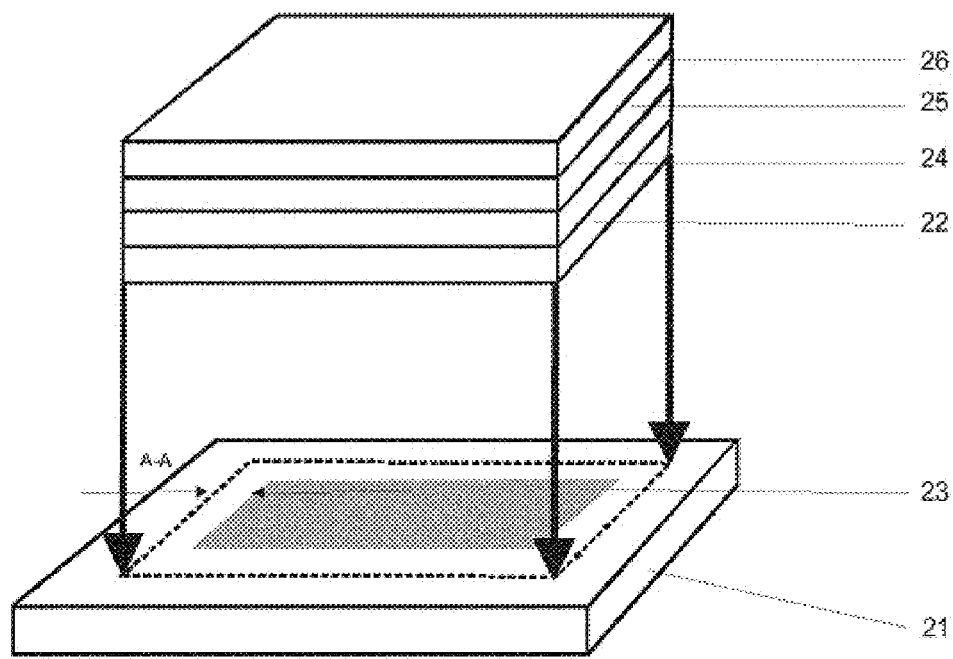

FIG. 4 shows a further (opto)electronic arrangement of the invention, in diagrammatic representation, as utilized in a test for determining the lifetime of an electronic construction.

FIG. 1 shows a first embodiment of an organic electronic arrangement 1 according to the prior art. This arrangement 1 has a substrate 2 on which an electronic structure 3 is arranged. The substrate 2 itself is designed as a barrier for permeates, and thus forms part of the encapsulation of the electronic structure 3. Disposed above the electronic structure 3, in the present case also at a distance from it, is a further liner 4 designed as a barrier.

In order to encapsulate the electronic structure 3 to the side as well, and at the same time to join the liner 4 to the electronic arrangement 1 in its remaining part, an adhesive 5 runs round adjacent to the electronic structure 3 on the substrate 2. It is unimportant here whether the adhesive has been joined first to the substrate 2 or first to the liner 4. The adhesive 5 joins the liner 4 to the substrate 2. As a result of an appropriately thick embodiment, moreover, the adhesive 5 allows the liner 4 to be distanced from the electronic structure 3.

The adhesive 5 is a prior-art adhesive, in other words an adhesive with a high permeation barrier, which may also have been filled to a high fraction with getter material. The transparency of the adhesive is not relevant in this construction.

An adhesive transfer tape would presently be provided in the form of a diecut, which on account of its delicate geometry would be more difficult to handle than an adhesive transfer tape applied substantially over the full area.

FIG. 2 shows an inventive embodiment of an (opto)electronic arrangement 1. Shown, again, is an electronic structure 3 which is disposed on a substrate 2 and is encapsulated by the substrate 2 from below. Above and to the side of the electronic structure, the inventive adhesive for example in the embodiment is now arranged as an adhesive transfer tape 6 over the full area. Accordingly, the electronic structure 3 is encapsulated fully from above by the adhesive transfer tape 6. A liner 4 is then applied to the adhesive transfer tape 6. The adhesive transfer tape 6 is one based on the inventive adhesive transfer tape as described above in general form and specified in more detail hereinafter in exemplary embodiments. In the version shown, the adhesive transfer tape consists only of a layer of an inventive adhesive.

In contrast to the preceding embodiment, the liner 4 is not mandatorily required to meet the high barrier requirements, since with a full-area covering of the electronic arrangement by the adhesive transfer tape, the barrier is provided by the adhesive already. The liner 4 may merely take on, for example, a mechanical protection function, or alternatively it may additionally be provided as a permeation barrier.

FIG. 3 shows an alternative embodiment of an (opto)electronic arrangement 1. In contrast to the preceding embodiments, there are now two adhesive transfer tapes 6*a*, *b*, which in the present case are identical in form, but which may also be different. The first adhesive transfer tape 6*a* is arranged on the full area of the substrate 2. The electronic structure 3 is provided on the adhesive transfer tape 6*a*, and is fixed by the adhesive transfer tape 6*a*. The assembly of adhesive transfer tape 6*a* and electronic structure 3 is then covered over its full area with the further adhesive transfer tape 6*b*, meaning that the electronic structure 3 is encapsulated from all sides by the adhesive transfer tapes 6*a*, *b*. Provided above the adhesive transfer tape 6*b*, in turn, is the liner 4.

In this embodiment, neither the substrate 2 nor the liner 4 need therefore mandatorily have barrier properties. They may, however, nevertheless be provided, in order to further restrict the permeation of permeates to the electronic structure 3.

In relation to FIGS. 2 and 3, in particular, it is noted that in the present case these are diagrammatic representations. From the representations it is in particular not apparent that the adhesive transfer tape, here and preferably and in each case, has a homogeneous layer thickness. At the transition to the electronic structure, therefore, there is not a sharp edge, as it appears in the representation, but instead the transition is fluid and it is possible instead for small unfilled or gas-filled regions to remain. If desired, however, there may also be conformation to the substrate, particularly when application is carried out under vacuum and/or an autoclave step follows. Moreover, the adhesive is compressed to different extents locally, and so, as a result of flow processes, there may be a certain compensation of the difference in height of the edge structures. The dimensions shown are also not to scale, but instead serve rather only for more effective representation. In particular, the electronic structure itself is generally of relatively flat design (often less than 1 μm thick).

Even direct contact of the adhesive with the electronic construction is not mandatory. It is also possible for other layers to be arranged in between, such as a thin-layer encapsulation of the electronic construction, or barrier films, for example.

The thickness of the adhesive transfer tape may span all customary thicknesses, in other words, approximately, from 1 μm up to 3000 μm. A thickness of between 25 and 100 μm is preferred, since, within this range, bond strength and handling properties are particularly positive. A further preferred range is a thickness of 3 to 25 μm, since in this range the amount of substances permeating through the bondline can be minimized solely by the small cross-sectional area of the bondline in an encapsulation application.

To produce an adhesive transfer tape of the invention, the carrier of the adhesive tape, or the liner, is coated or printed on one side with the adhesive of the invention, from solution or dispersion or in 100% form (as a melt, for example), or the tape is produced by (co)extrusion. An alternative form of production is by transfer of a layer of adhesive of the invention by lamination to a carrier material or a liner. The layer of adhesive may be crosslinked by heat or high-energy radiation.

This operation preferably takes place in an environment in which the specific permeate is present only in a low concentration or almost not at all. An example that may be given is a relative atmospheric humidity of less than 30%, preferably of less than 15%.

To optimize the properties it is possible for the adhesive employed to be blended with one or more additives such as tackifiers (resins), plasticizers, fillers, pigments, UV absorbers, light stabilizers, aging inhibitors, crosslinking agents, crosslinking promoters or elastomers.

The amount of a layer of adhesive may be within the limits of the amount customary in the adhesive tape sector, that is about from 1 to 3000 $g/m^2$. It is preferably 1 to 120 $g/m^2$, preferably 10 to 100 $g/m^2$, where "amount" means the amount after any removal of water or solvent that may be carried out.

Test Methods

The measurements are carried out under test conditions of 23±1° C. and 50±5% relative humidity.

Measurement of Haze and of Transmittance

The HAZE value describes the fraction of transmitted light which is scattered forward at large angles by the irradiated sample. The HAZE value hence quantifies the opaque properties of a layer that disrupt clear sight through.

The transmittance and the haze of the adhesive are determined in analogy to ASTM D1003-11 (Procedure A (Byk Haze-gard Dual hazemeter), standard illuminant D65) at room temperature on the adhesive in a layer 50 μm thick. No correction is made for interfacial reflection losses.

Since for thin adhesive transfer tapes, correct application in the measuring instrument is important in order not to falsify the result, an auxiliary carrier was used. The carrier used was a PC film from GE Plastics (Lexan 8010 film, thickness 125 μm).

This carrier met all of the criteria (smooth, planar surface, very low haze, high transmittance, high homogeneity) in order for the adhesive tape specimens to be mounted in a planar manner on the measuring channel.

The measurements were performed on crosslinked adhesive tapes.

Measurement of Refractive Index

The refractive index is determined in a method based on ISO 489 (method A, measuring wavelength 589 nm) at a temperature of 20° C. and a relative humidity of 50%. Shaped articles were produced from the particles by means of pressure and temperature. The contact fluid used in the measurement was cinnamon oil.

Measurement of Water Vapor Permeation Rate
WVTR

The WVTR is in this case at 38° C. and 90% relative humidity in accordance with ASTM F-1249. A duplicate determination is carried out in each case, and an average formed. The value reported is standardized for a thickness of 50 μm/is based on the particular thickness of the test specimen measured.

For the measurements, the adhesive transfer tapes were bonded to a highly permeable polysulfone membrane (available from Sartorius) which itself makes no contribution to the permeation barrier. The measurements were conducted on crosslinked adhesive tapes.

Lifetime Test

As a measure for determining the lifetime of an electronic construction, a calcium test was employed. This test is shown in FIG. 4. It involves depositing a thin layer of calcium 23, measuring 10×10 $mm^2$, under reduced pressure onto a glass plate 21, and then storing the assembly under a nitrogen atmosphere. The thickness of the calcium layer 23 is approximately 100 nm. The calcium layer 23 is encapsulated using an adhesive tape (23×23 $mm^2$) with the adhesive 22 under test and with a thin glass sheet 24 (30 μm, from Schott) as carrier material. For stabilization, the thin glass sheet was laminated with a PET film 26 that was 100 μm thick, using an adhesive transfer tape 25 that was 50 μm thick, the tape comprising a pressure-sensitive acrylate adhesive of high optical transparency. The adhesive 22 is applied to the glass plate 21 in such a way that the adhesive 22 covers the calcium mirror 23 with a margin of 6.5 mm (A-A) remaining all round. Because of the impervious glass carrier 24, the permeation ascertained is only that through the PSA or along the interfaces.

The test is based on the reaction of calcium with water vapor and oxygen, as described by, for example, A. G. Erlat et al. in "47th Annual Technical Conference Proceedings—Society of Vacuum Coaters", 2004, pages 654 to 659, and by M. E. Gross et al. in "46th Annual Technical Conference Proceedings—Society of Vacuum Coaters", 2003, pages 89 to 92. The light transmittance of the calcium layer is monitored in the test, and increases as a result of the conversion to calcium hydroxide and calcium oxide. In the case of the test construction described, this increase takes place starting from the margin, and so the visible area of the calcium mirror goes down. The time taken for the absorption of light by the calcium mirror to halve is termed the lifetime. The method captures not only the degradation of the surface of the calcium mirror from the margin and on the surface, as a result of local degradation, but also the uniform reduction in the layer thickness of the calcium mirror as a result of full-area degradation.

Measurement conditions selected were 60° C. and 90% relative humidity. The specimens were bonded over the full area, without bubbles, with a 50 µm thickness of the PSA layer. The measurements were carried out on crosslinked adhesive tapes. The result (in h) was obtained as the average value from three individual measurements.

From the time taken for the calcium mirror to break down completely, moreover, a water vapor permeation rate (Carbon atoms-WVTR) is calculated. This is done by multiplying the mass of the vapor-applied calcium by a factor of 0.9 (mass ratio $H_2O$/Carbon atoms for the conversion reaction of metallic calcium to transparent calcium hydroxide) in order to determine the mass of the water vapor that has entered by permeation. This is then related to the permeation cross section (peripheral length of the test construction x thickness of adhesive) and also to the time taken for the calcium mirror to break down completely. The computed measurement is also divided by the width of the all-round edge (in mm) and thereby standardized to a permeation distance of 1 mm. The Carbon atoms-WVTR is reported in $g/m^2*d$.

Measurement of MMAP and DACP

MMAP is the mixed methylcyclohexane-aniline cloud point, determined using a modified ASTM C 611 method. Methylcyclohexane is employed for the heptane used in the standard test procedure. The method uses resin/aniline/methylcyclohexane in a ratio of 1/2/1 (5 g/10 ml/5 ml), and the cloud point is determined by cooling a heated clear mixture of the three components until complete clouding just ensues.

The DACP is the diacetone cloud point, and is determined by cooling a heated solution of 5 g of resin, 5 g of xylene and 5 g of diacetone alcohol to the point at which the solution turns cloudy.

Measurement of Peel Adhesion

The peel adhesions on glass were determined in a method similar to ISO 29862 (method 3) at 23° C. and 50% relative humidity, with a peel speed of 30 mm/min and a peel angle of 180°. The reinforcing film used was an etched PET film having a thickness of 36 µm, as obtainable from Coveme (Italy). The measurement strip was bonded in this case by means of a rolling machine at a temperature of 23° C. The adhesive tapes were peeled off immediately after application. The measurement (in N/cm) was the average from three individual measurements.

Softening Temperature

The softening temperature of copolymers, hard blocks and soft blocks, and uncured reactive resins is determined calorimetrically by way of Differential Scanning calorimetry (DSC) according to DIN 53765:1994-03. Heating curves run with a heating rate of 10 K/min. The specimens are measured in Al crucibles with perforated lids under a nitrogen atmosphere. The heating curve evaluated is the second heating curve. Amorphous substances give glass transition temperatures, while (semi)crystalline substances give melting temperatures. A glass transition can be seen as a step in the thermogram. The glass transition temperature is evaluated as the middle point of this step. A melting temperature can be seen as a peak in the thermogram. The melting temperature recorded is the temperature at which the greatest heat change occurs.

Molecular Weight

The molecular weight determinations of the weight-average molecular weights $M_w$ and of the number-average molecular weights $M_n$ took place by means of gel permeation chromatography (GPC). The eluent used was THF (tetrahydrofuran) with 0.1 vol % of trifluoroacetic acid. The measurement was made at 25° C. The pre-column used was PSS-SDV, 5µ, $10^3$ Å, ID 8.0 mm×50 mm. For the separation, the columns used were PSS-SDV, 5µ, $10^3$ and also $10^5$ and 106 each with ID 8.0 mm×300 mm. The sample concentration was 4 g/I, the flow rate 1.0 ml per minute Measurement took place against polystyrene standards.

Elongation at Break

The elongation at break is determined in accordance with ISO 29864 (method A, 20 mm test strip width) at 23° C. and 50% relative humidity. The test is carried out on adhesive specimens 500 µm thick.

EXAMPLES

In the text below, the invention will be elucidated in more detail by examples, but without wishing to restrict the invention to these examples.

Adhesive

Unless otherwise indicated, all quantities in the examples below are percentages by weight or parts by weight based on the overall composition without photoinitiator. The amount of photoinitiator is based on the amount of epoxy resin used.

Activatable Pressure-Sensitive Adhesive:

| 33.4 parts | SibStar 62 M | SiBS (polystyrene-block-polyisobutylene block copolymer) from Kaneka with 20 wt % block polystyrene content |
| --- | --- | --- |
| 33.3 parts | Uvacure 1500 | cycloaliphatic diepoxide from Cytec, viscosity at 23° C. about 300 mPas |
| 33.3 parts | Escorez 5300 | a fully hydrogenated hydrocarbon resin from Exxon ring and ball softening 105° C., DACP = 71, MMAP = 72 |
| 1 part | Triarylsulfonium hexafluoro-antimonate | cationic photoinitiator from Sigma-Aldrich The photoinitiator has an absorption maximum in the 320 nm to 360 nm range and took the form of a 50 wt % strength solution in propylene carbonate |

For the activatable pressure-sensitive adhesive used as adhesive in the examples, the polymer basis selected was a polystyrene-block-polyisobutylene block copolymer from Kaneka. The fraction of styrene in the polymer as a whole is 20 wt %. The molar mass is 60 000 g/mol. The glass transition temperature of the polystyrene blocks is 100° C. and that of the polyisobutylene blocks is −60° C.

The tackifying resin selected was Escorez 5300, a fully hydrogenated hydrocarbon resin from Exxon.

The active resin selected was Uvacure 1500 from Dow, a cycloaliphatic diepoxide (3,4-epoxycyclohexylmethyl 3,4-epoxycyclohexanecarboxylate). The glass transition temperature of Uvacure 1500 is −53° C.

These raw materials were dissolved at room temperature in a mixture of toluene (300 parts), acetone (150 parts), and special-boiling-point spirit 60/95 (550 parts), to give a 50 wt % solution.

When all of the solid constituents had fully dissolved, the fillers were added. Homogeneous distribution in the adhesive was achieved by using a high-speed laboratory stirrer having a dispersing disk. The weighed-out particles (5% of the solids content of the adhesive) were added in portions to the adhesive already being stirred. Following full addition, the composition was dispersed for 30 minutes. In order to comminute agglomerated solids still present subsequently, the composition was worked on by means of an Ultra-Turrax (from IKA) for a further 5 minutes.

The solution of the photoinitiator was then added.

For the production of adhesive transfer tapes, the adhesives were applied from solution to a conventional siliconized PET liner (Silphan S50 M374 from Siliconature) by means of a laboratory coater. Drying took place initially with 10-minute room-temperature storage, followed by a period of a further 10 minutes in a drying oven at 120° C. Immediately after drying, the layers of adhesive were lined with a further siliconized PET liner (Silphan S50 M371). The thickness of the adhesive layer after drying was 50 μm in each case.

For different tests, the adhesive tapes after application were cured in the test construction using UV light (UV dose: sum of UV-A+B+C, determined using the Power Puck from EIT, of 2000 mJ/cm$^2$). This was done using a laboratory UV irradiation unit from Eltosch with a medium-pressure mercury lamp. Following UV irradiation, the respective construction was after-crosslinked in a drying cabinet at 80° C. for 30 minutes. Fillers used were as follows (table 3):

| Filler | | Description | Particle size d50 [μm] | Refractive index (23° C.) |
|---|---|---|---|---|
| F1 | Ceridust 9202 F | micronized, low molecular mass polytetrafluoroethylene (PTFE) from Clariant | 4 | 1.35 |
| F2 | Ceridust 3920 F | PTFE modified PE wax from Clariant | 5 | 1.39 |
| F3 | Tospearl 3120 | micronized silicone resin from Momentive | 12 | 1.40 |
| F4 | Ceridust 2051 | micronized hydrocarbon wax from Clariant | 7 | 1.51 |
| F5 | Spheromers CA15-1 | PMMA beads from Microbeads AS | 15 | 1.49 |
| F6 | Mowital B60HH | polyvinyl butyral from Kuraray with a polyvinyl alcohol content of 14 wt % and a polyvinyl acetate content of 2.5 wt % | 50 | 1.48 |
| F7 | Syloid ED2 | amorphous silica from Grace | 4 | 1.44* |
| F8 | AEROSIL R972 | fumed silica hydrophobized with dimethyldichlorosilane, from Evonik | 0.016 (primary) | 1.44* |

*literature value (at about 20-30° C.)
Fillers F3 to F8 result in noninventive examples (comparative examples C1-C6).

Table 4 presents the adhesives produced, which were subsequently processed to form adhesive transfer tapes. Additionally shown are the values found for haze and transmittance.

For example B3, in addition to the filler, vinyltrimethoxysilane (VTMS) was added as a molecularly dispersible getter.

| | Filler | | Fraction of filler [wt %] | Haze [%] | Transmittance [%] |
|---|---|---|---|---|---|
| B1 | F1 | Ceridust 9202 F | 5 | 56.9 | 90.6 |
| B2 | F2 | Ceridust 3920 F | 5 | 21.5 | 92.4 |
| B3 | F1 | Ceridust 9202 F VTMS | 5 5 | 54.8 | 91.2 |
| B4 | F1 | Ceridust 9202 F | 1 | 16.57 | 92 |
| B5 | F1 | Ceridust 9202 F | 2.5 | 35.73 | 91.3 |
| B6 | F1 | Ceridust 9202 F | 10 | 80.43 | 89.17 |
| C1 | F4 | Ceridust 2051 | 5 | 9.7 | 92.9 |
| C2 | F5 | Spheromers CA15-1 | 5 | 13.7 | 92.6 |
| C3 | F6 | Mowital B60HH | 5 | 6.9 | 92.4 |
| C4 | F7 | Syloid ED2 | 5 | 28.8 | 92.6 |
| C5 | F8 | AEROSIL R972 | 5 | 2.3 | 92.5 |
| C6 | F3 | Tospearl 3120 | 5 | 20.1 | 92.9 |
| C7 | — | none | 0 | 0.61 | 93.2 |

The experiments show that surprisingly, below a refractive index of 1.45 (examples B1-B6 and also comparative examples C4 and C6), for a given filler content, a substantially greater haze is obtained with a transmittance barely increased relative to the unfilled adhesive (C5). This effect is particularly strong for a refractive index of less than 1.41 (B2, C6), and especially strong for a refractive index of less than 1.37 (B1, B3, B4-B6).

The refractive index of the crosslinked adhesive was determined as being 1.53. it is also apparent from this that a difference in the refractive index of more than 0.08, more particularly of more than 0.12, and very preferably of more than 0.16 is beneficial to a high translucency. One preferred embodiment of the adhesive therefore has domains whose refractive index is more than 0.8, more particularly more than 0.12, and very preferably more than 0.16 below that of the continuous phase.

Example B3 shows that a molecularly dispersible getter material does not influence the translucency. A getter material of this kind is therefore preferred.

Furthermore, the bond strength of the uncrosslinked adhesive transfer tapes was determined. Table 5 presents the results:

| Example | Peel adhesion on glass [N/cm] crosslinked adhesive |
|---|---|
| B1 | 4.9 |
| C7 | 6.4 |

It follows from this that the addition of polymeric fillers reduces the peel adhesion only slightly. For the use of the adhesive for encapsulating an optoelectronic construction, the remaining peel adhesion is completely sufficient.

The following permeation rates were ascertained (standardized to a thickness of 50 μm):

| Example | WVTR [g/m$^2$ d] |
|---|---|
| B1 | 8.4 |
| B2 | 8.0 |
| C4 | 12.9 |
| C6 | 20.2 |
| C7 | 7.9 |

The comparison of the permeation rate of examples B1 and B2 with the unfilled adhesive (C7) shows only a slight change, explainable by the water repellency properties of the fluorine-containing filler. The silicone-based filler F3 in C6 has a very high WVTR, as known for silicones. There is therefore a marked deterioration in the WVTR of the adhesive. Silicones, therefore, are not suitable for the application, and fluorine-containing polymers are preferred.

The inorganic filler in C4, while not itself water vapor permeable, does increase the polarity in the adhesive, and so the WVTR goes up. This shows one disadvantage of polar inorganic fillers.

Furthermore, the lifetime test was carried out. Permeation rates determined were as follows (table 6):

| Example | Ca-WVTR [g/m² d] |
|---------|------------------|
| B1 | 0.38 |
| B3 | 0.24 |
| C7 | 0.30 |

The permeation rates determined in the calcium test likewise show that the barrier properties are impaired only slightly (B1 vs. C7) as a result of adding the fluorine-containing polymer. The further addition of a getter material (B3) leads to significantly improved permeation properties.

The invention claimed is:

1. A translucent multiphase adhesive comprising at least one continuous phase as well as dispersely distributed domains, the at least one continuous phase comprising:
    a refractive index of more than 1.45 and
    a water vapor permeation rate of less than 100 g/m², and the disperse domains
    have an average diameter in a size range from 0.1 µm to 50 µm,
    are present in a weight fraction of not more than 10 wt % in the adhesive, and
    wherein the disperse domains are polymeric in nature, have a WVTR of less than 100 g/m²d, and have a refractive index of less than 1.45.
2. The adhesive according to claim 1,
    further wherein,
    the average diameter (d50) of the polymeric disperse domains is in a size range between 0.1 µm and 50 µm.
3. The adhesive according to claim 1,
    further wherein,
    the weight fraction of the dispersely distributed polymeric domains in the adhesive is more than 1 wt %,
    more particularly between 1 and 5 wt % when the refractive index of the domains is below 1.40, and more particularly between 5 and 10 wt % when the refractive index of the domains is 1.45.
4. The adhesive according to claim 1,
    further wherein,
    the polymeric disperse domains have a refractive index of less than 1.41, preferably of less than 1.37.
5. The adhesive according to claim 1,
    further wherein,
    the continuous phase in the visible light of the spectrum (wavelength range from 400 nm to 800 nm) exhibits a transmittance of more than 70% and/or a haze of less than 5.0%, preferably less than 2.5%.
6. The adhesive according to claim 1,
    further wherein,
    the adhesive at a layer thickness of 50 µm has a water vapor permeation rate of less than 50 g/(m²·d) and/or an oxygen transmission rate of less than 5000 g/(m²·d·bar).
7. The adhesive according to claim 1,
    further wherein,
    the adhesive in a layer 50 µm thick is a light-scattering adhesive having a light transmittance of more than 70% and a haze of more than 10%.
8. The adhesive according to claim 1,
    further wherein,
    the adhesive has only one continuous phase and only one disperse phase.
9. The adhesive according to claim 1,
    further wherein,
    the polymer of the disperse polymeric domains comprises fluorine, preferably in that the polymeric domains are present in the form of fluorine-containing microcrystalline waxes.
10. The adhesive according to claim 1,
    further wherein,
    the adhesive consists of a continuous phase containing an adhesive, and a dispersed phase containing a distributed particulate filler.
11. The adhesive according to claim 10,
    wherein,
    the filler is present in the form of particles in a particle size distribution wherein not more than 1 vol % of the filler exceeds the average layer thickness of the layer of adhesive.
12. The adhesive according to claim 10,
    wherein,
    the continuous phase of adhesive is a pressure-sensitive adhesive or is an activatable adhesive, more particularly a pressure-sensitive adhesive.
13. The adhesive according to claim 1,
    wherein,
    the adhesive is a pressure-sensitive adhesive or is an activatable adhesive, more particularly a pressure-sensitive adhesive.
14. The adhesive according to claim 1,
    further wherein,
    the adhesive comprises at least one getter material which is adapted to sorb at least one permeable substance.
15. The adhesive according to claim 14,
    further wherein,
    the amount of getter material in the adhesive is not more than 10 wt %, preferably not more than 5 wt %, and at the same time is at least 0.01 wt %, preferably at least 0.05 wt %.
16. The adhesive according to claim 14,
    further wherein, the getter material is in nanoscale form, more particularly such that the extent in at least one dimension is not more than 500 nm, preferably not more than 200 nm, very preferably not more than 100 nm.
17. The adhesive according to claim 1,
    further wherein, the refractive indices of the continuous phase and of the disperse domains differ by more than 0.8, preferably more than 0.12, and very preferably more than 0.16.
18. An adhesive tape comprising a layer of an adhesive according to claim 1.
19. The adhesive tape according to claim 17,
    wherein
    the adhesive tape comprises a layer of the adhesive and additionally comprises at least one further layer selected from: an adhesive, a carrier material and a liner.

20. The adhesive tape according to claim 18,
wherein,
the carrier material is a polymeric carrier material.
21. The adhesive tape according to claim 19,
wherein,
the carrier material comprises at least one in organic barrier layer.
22. A method for protecting an organic electrical arrangement disposed on a substrate, in which a cover is applied to the electronic arrangement in such a way that the electronic arrangement is at least partly covered by the cover,
and the cover is adhesively bonded at least over part of the area to the substrate and/or to the electronic arrangement,
where the adhesive bond includes at least one layer of an adhesive according to claim 1.
23. The method according to claim 21,
further wherein
the layer of adhesive is a layer of an adhesive tape.
24. The method according to claim 21,
further wherein,
the cover is adhesively bonded by first applying a layer of the adhesive, optionally as part of a double-sided adhesive tape comprising further layers, and,
thereafter, applying a liner to the substrate and/or the electronic arrangement.
25. The method according to claim 24,
further wherein
the layer of adhesive and the liner are applied jointly to the substrate and/or the electronic arrangement.
26. The method according to claim 21,
further wherein,
the liner completely covers the electronic arrangement.
27. The method according to claim 21,
further wherein,
in addition to the electronic arrangement, a region of the substrate near the electronic arrangement is also at least partly covered by the liner.
28. The method according to claim 21,
further wherein,
the layer of adhesive completely covers the electronic arrangement.
29. A translucent multiphase adhesive comprising at least one continuous phase as well as dispersely distributed domains, the at least one continuous phase comprising:
a refractive index of more than 1.45 and
a water vapor permeation rate of less than 100 g/m$^2$, and
the disperse domains
have an average diameter in a size range from 0.1 μm to 50 μm, and also
are present in a weight fraction of not more than 10 wt % in the adhesive, wherein, the disperse domains are selected from the group consisting of:
poly(hexafluoropropylene oxide);
poly(tetrafluoroethylene-co-hexafluoropropylene);
fluorinated ethylene propylene;
poly(pentadecafluorooctyl acrylate);
poly(tetrafluoro-3-(heptafluoropropoxy)propyl acrylate);
poly(tetrafluoro-3-(pentafluoroethoxy)propyl acrylate);
poly(tetrafluoroethylene);
tetrafluoroethylene hexafluoropropylene vinylidene fluoride;
poly(undecafluorohexyl acrylate);
perfluoroalkoxy;
ethylene tetrafluoroethylene;
poly(nonafluoropentyl acrylate);
poly(tetrafluoro-3-(trifluoromethoxy)propyl acrylate);
poly(pentafluorovinyl propionate);
poly(heptafluorobutyl acrylate);
poly(trifluorovinyl acetate);
poly(octafluoropentyl acrylate;)
poly(methyl 3,3,3-trifluoropropyl siloxane);
poly(pentafluoropropyl acrylate);
poly(2-heptafluorobutoxy)ethyl acrylate);
poly(chlorotrifluoroethylene);
poly(2,2,3,4,4-hexafluorobutyl acrylate);
poly(trifluoroethyl acrylate);
poly(2-(1,1,2,2-tetrafluoroethoxy)ethyl acrylate);
poly(trifluoroisopropyl methacrylate);
poly(2,2,2-trifluoro-1-methylethyl methacrylate);
poly(2-trifluoroethoxyethyl acrylate);
poly(vinylidene fluoride);
ethylene chlorotrifluoroethylene;
poly(trifluoroethyl methacrylate); and,
poly(isobutyl methacrylate).
30. A translucent multiphase adhesive comprising at least one continuous phase as well as dispersely distributed domains, the at least one continuous phase comprising:
a refractive index of more than 1.45 and
a water vapor permeation rate of less than 100 g/m$^2$,
and the disperse domains
have an average diameter in a size range from 0.1 μm to 50 μm, and also
are present in a weight fraction of not more than 10 wt % in the adhesive,
wherein:
the disperse domains are selected from the group consisting of:
poly(hexafluoropropylene oxide) (PHFPO),
fluorinated ethylene propylene polymer (FEP),
poly(tetrafluoroethylene) (PTFE),
poly(tetrafluoroethylene hexafluoropropylene vinylidene fluoride) (THV),
perfluoroalkoxy polymer (PFA),
poly(ethylene tetrafluoroethylene) (ETFE),
poly(chlorotrifluoroethylene) (PCTFE),
poly(vinylidene fluoride) (PVDF), and,
poly(ethylene chlorotrifluoroethylene) (ECTFE),
as well as co-polymers and terpolymers thereof.

* * * * *